(12) United States Patent
Solomon et al.

(10) Patent No.: US 8,022,394 B2
(45) Date of Patent: Sep. 20, 2011

(54) MOLECULAR QUANTUM INTERFERENCE APPARATUS AND APPLICATIONS OF SAME

(75) Inventors: Gemma Solomon, Chicago, IL (US); David Andrews, Alexandria, VA (US); Mark Ratner, Glencoe, IL (US)

(73) Assignee: Northwestern University, Evanston, IL (US)

( * ) Notice: Subject to any disclaimer, the term of this patent is extended or adjusted under 35 U.S.C. 154(b) by 247 days.

(21) Appl. No.: 12/338,648

(22) Filed: Dec. 18, 2008

(65) Prior Publication Data
US 2009/0250688 A1 Oct. 8, 2009

Related U.S. Application Data

(60) Provisional application No. 61/014,563, filed on Dec. 18, 2007.

(51) Int. Cl.
*H01L 31/00* (2006.01)
*H01L 29/06* (2006.01)
(52) U.S. Cl. .............. 257/25; 257/9; 257/E51.023
(58) Field of Classification Search .......... 257/14, 257/24, 25, 414, E29.069, 9, E51.023, E51.047, 257/E51.045
See application file for complete search history.

(56) References Cited

OTHER PUBLICATIONS

Reed et al, "Molecular random access memory cell", 2001, Applied Physics letters, vol. 78, No. 23, pp. 3735-3737.*
Tao, "Electron transport in molecular junctions", 2006, Nature Nanotechnology, vol. 1, pp. 173-181, Dec. 2006.*
Seferos et al., "Probing-coupling in molecular junctions", 2005, PNAS, vol. 102, No. 25, pp. 8821-8825, Jun. 21, 2005.*
Patoux et al., "Topological effects on intramolecular electron transfer via quantum interference", 1997, Inorg. Chem., vol. 36, pp. 5037-5049.*
Reed et al., "Conductance of a molecular junction", 1997, Science, vol. 278, pp. 252-254 (Oct. 10, 1997).*
Gholami et al., "Oligomeric and Polymeric Systems with Cross-conjugated π-Framework", 2006, Chem. Rev., vol. 106, pp. 4997-5027.*
Kurt Stokbro et al., TranSIESTA, A Spice for Molecular Electronics, Ann. N.Y. Acad. Sci. 1006, 2003, p. 212-226.
C. Zhou et al., Nanoscale metal/self-assembled monolayer/metal heterostructures, Appl. Phys. Lett., Aug. 4, 1997, p. 611-613. vol. 71, No. 5.
T. Zheng et al., Characterization of conductance under finite bias for a self-assembled monolayer coated Au quantized point contact, Applied surface science, 2006, p. 1265-1268.
Joon Cho et al., Synthesis and characterization of cross-conjugated oligo(phenylene enynylene)s, Arkivoc, 2005, p. 142-150, vol. iv.
R.A. Marcus et al, Electron transfers in chemistry and biology, Biochimica et Biophysica Acta, 1985, p. 265-322, vol. 811.

(Continued)

*Primary Examiner* — Thomas L Dickey
*Assistant Examiner* — Nikolay Yushin
(74) *Attorney, Agent, or Firm* — Morris, Manning & Martin, LLP; Tim Tingkang Xia, Esq.

(57) ABSTRACT

A molecular quantum interference device for use in molecular electronics. In one embodiment, the device includes a molecular quantum interference unit having a first terminal group and a second terminal group between which quantum interference affects electrical conduction, a molecular spacer having a first terminal group and a second terminal group and coupled to the molecular quantum interference unit through a chemical bonding between the first terminal group of the molecular spacer and the second terminal group of the molecular quantum interference unit, a first electrode electrically coupled to the molecular quantum interference unit and configured to supply charge carriers to or receive charge carriers from the molecular quantum interference unit, and a second electrode electrically coupled to the molecular spacer and configured to receive charge carriers from or supply charge carriers to the molecular spacer.

25 Claims, 16 Drawing Sheets

OTHER PUBLICATIONS

Mojtaba Gholami et al., Oligomeric and Polymeric Systems with a Cross-conjugated p-Framework, Chem. Rev., 2006, p. 4997-5027, vol. 106.

Geoffrey J. Ashwell et al., Single-molecule electrical studies on a 7 nm long molecular wire, Chem. Commun., 2006, p. 4706-4708.

Vladimiro Mujica et al., Molecular rectification; why is it so rare? Chemical Physics, 2002, p. 147-150, vol. 281.

Robert M. Metzger, Unimolecular rectifiers: Present status, Chemical Physics, 2006, p. 176-167, vol. 326.

Arieh Aviram et al., Molecular Rectifiers, Chemical Physics Letters, Nov. 15, 1974, p. 277-283, vol. 29, No. 2.

P. Sautet et al., Electronic Interference Produced by A Benzene Embedded in A Polyacetylene Chain, Chemical Physics Letters, Dec. 30, 1988, p. 511-516, vol. 153, No. 6.

Robert M. Metzger., Unimolecular Electrical Rectifiers, Chem. Rev. 2003, p. 3803-3834, vol. 103.

Maurizio Bruschi at al., trans versus geminal Electron Delocalization in Tetra-and Diethynylethenes: A New Method of Analysis, Chem. Eur. J. 2002, p. 4216-4227, vol. 8, No. 18.

Maria Grazia Giuffreda et al., Electron Delocalization in Linearly π-Conjugated Systems: A Concept for Quantitative Analysis, Chem. Eur. J. 2004, p. 5671-5680, vol. 10.

Nicolle N. P. Moonen et al., Donor-Substituted Cyanoethynylethenes: π-Conjugation and Band-Gap Tuning in Strong Charge-Transfer Chromophores, Chem. Eur. J. 2005, p. 3325-3341, No. 11.

Maurizio Bruschi et al., Through versus Cross Electron Delocalization in Polytriacetylene Oligomers: A Computational Analysis, ChemPhysChem, 2005, p. 511-519, vol. 6.

Xiulan Li et al., Controlling charge transport in single molecules using electrochemical gate, Faraday Discuss., 2006, p. 111-120, vol. 131.

Andrey V. Danilov et al., Strong electronic coupling between single C60 molecules and gold electrodes prepared by quench condensation at 4 K. A single molecule three terminal device study, Faraday Discuss., 2006, p. 337-345, vol. 131.

Herre S. J. Van Der Zant et al., Molecular three-terminal devices: fabrication and measurements, Faraday Discuss., 2006, p. 347-356, vol. 131.

Landauer, R., Spatial Variation of Currents and Fields Due to Localized Scatterers in Metallic Conduction, IBM Journal of Research Development, 1957, No. 1.

Tim Albrecht et al., Transistor Effects and in Situ STM of Redox Molecules at Room Temperature, IEEE Transactions on Nanotechnology, Jul. 2005, p. 430-434, vol. 4, No. 4.

Wolfgang Haiss at al., Redox State Dependence of Single Molecule Conductivity, J.Am. Chem. Soc. 2003, p. 15294-15295, vol. 125.

Gemma C. Solomon et al., When Things Are Not as They Seem: Quantum Interference Turns Molecular Electron Transfer "Rules" Upside Down, J. Am. Chem. Soc., 2008, p. 7788-7789, vol. 130, No. 25.

Michael Galperin et al., Molecular transport junctions: vibrational effects, Journal of Physics: Condensed. Matter, 2007, 103201.

J. E. Meinhard et el., organic Rectifying Junction, Journal of Applied Physics, 1964, p. 3059-3060, 35.

Nelson F. Phelan et al., Cross Conjugation, Journal of Chemical Education, Oct. 1968, p. 633-637. vol. 45, No. 10.

R.A. Marcus, On the Theory of Oxidation-Reduction Reactions Involving Electron Transfer. I, The Journal of Chemical Physics, May 1956, p. 966-978, vol. 24, No. 5.

Axel D. Becke, Density-functional thermochemistry. III. The role of exact exchange, J. Chem. Phys., Apr. 1, 1993, p. 5648-5652, vol. 98, No. 7.

Vladimiro Mujica et al., Current-voltage characteristics of molecular wires: Eigenvale staircase, Coulomb blackade, and rectification, J.Chem. Phys., May 8, 1996, p. 7296-7305, vol. 104, No. 18.

Weidong Tian et al., Conductance spectra of molecular wires, J. Chem. Phys., Aug. 15, 1998, p. 2874-2882, vol. 109, No. 7.

Ante Bilic et al., The structure, energetics, and nature of the chemical bonding of phenylthiol adsorbed on the Au (111) surface: Implications for density-functional calculations of molecular-electronic conduction, The Journal of Chemical Physics, 2005, p. 094708-1-15, vol. 122.

Gemma C. Solomon et al., The symmetry of single-molecule conduction, The Journal of Chemical Physics. 2006, p. 184702-1-5, vol. 125.

Nongjian Tao, Measurement and control of single molecule conductance, J. Mater. Chem., 2005, p. 3260-3263, vol. 15.

Jeffrey R. Reimers et al., Rigid Fused Oligoporphyrins as Potential Versatile Molecular Wires. 2. B3LYP and SCF Calculated Geometric and Electronic Properties of 98 Oligoporphyrin and related Molecules, J. Phys. Chem. A., 1999, p. 4385-4397, vol. 103.

David Q. Andrews et al., Quantum Interference: The Structural Dependecne of Electron Transmission through Model Systems and Cross-Conjugated Molecules, J. Phys. Chem. C, 2008, p. 16991-16998, vol. 112.

Thomas Frauenheim et al., Atomistic simulations of complex materials: ground-state and excited-state properties, J. Phys.: Condens. Matter, 2002, p. 3015-3047, vol. 14.

Michael Galperin et al., Molecular transport junctions: vibrational effects, J. Phys.: Condens. Matter, 2007, 103201.

Robert M. Metzger et al., Unimolecular Electrical Rectification in Hexadecylquinolinium Tricyanoquinodimethanide, J. Am. Chem. Soc. 1997, p. 10455-10466, vol. 119. No. 43.

Kurt Stokbro et al., Do Avlram-Ratner Diodes Rectify? J. Am. Chem. Soc. 2003. p. 3674-3675, vol. 125, No. 13.

Gemma C. Solomon et al., Quantum Interference in Acyclic Systems: Conductance of Cross-Conjugated Molecules, J. Am. Chem. Soc. 2008, p. 17301-17308, vol. 130, No. 51.

Alessandro Troisi et al., Conformational Molecular Rectifiers, Nano Letters, 2004, p. 591-595, vol. 4, No. 4.

Fan Chen et al., A Molecular Switch Based on Potential-Induced Changes of Oxidation State, Nano Letters, 2005, p. 503-506, vol. 5, No. 3.

Nathan P. Guisinger et al., Room Temperature Negative Differential Resistance through Individual Organic Molecules on Silicon Surfaces, Nano Letters, 2004, p. 55-59, vol. 4, No. 1.

Tim Albrecht et al., Transistor-like Behavior of Transition Metal Complexes, Nano Letters, 2005, p. 1451-1455, vol. 5, No. 7.

Nicholas Armstrong et al., Exploring the Performance of Molecular Rectifiers: Limitations and Factors Affecting Molecular Rectification, Nano Letters, 2007, p. 3018-3022, vol. 7, No. 10.

Xuefeng Guo et al., Single-Molecule Devices as Scaffolding for Multicomponent Nanostructure Assembly, Nano Letters, 2007, p. 1119-1122, vol. 7, No. 5.

David Q. Andrews et al., Stochastic Modulation in Molecular Electronic Transport Junctions: Molecular Dynamics Coupled with Charge Transport Calculations, Nano Letters, 2008, p. 1120-1126, vol. 8. No. 4.

Lam H Yu et al., Transport in single-molecule transistors: Kondo physics and negative differential resistance, Nanotechnology, 2004, p. S517-S524, Vol. 15.

N P Guisinger et al., Observed suppression of room temperature negative differential resistance in organic monolayers on Si(100), Nanotechnology, 2004, p. S452-S458, vol. 15.

Jin He et al., Switching of a photochromic molecule on gold electrodes: single-molecule measurements, Nanotechnology, 2005, p. 695-702, vol. 16.

C. Joachim et al., Electronics using hybrid-molecular and mono-molecular devices, Nature, Nov. 30, 2000, p. 541-548, vol. 408.

Christopher C. Moser et al., Nature of biological electron transfer, Nature, Feb. 27, 1992, p. 796-802, vol. 355.

Jiwoong Park et al., Coulomb blockade and the Kondo effect in single-atom transistors, Nature, Jun. 13, 2002, p. 722-725, vol. 417.

Wenjie Liang et al., Kondo resonance in a single-molecule transistor, Nature, Jun. 13, 2002, p. 725-729, vol. 417.

Sergey Kubatkin et al., Single-electron transistor of a single organic molecule with access to several redox states, Nature, Oct. 16, 2003, p. 698-701, vol. 425.

Tali Dadosh et al., Measurement of the conductance of single conjugated molecules, Nature, 2005, p. 677-680, vol. 436.

Nikolaos Tombros et al., Electronic spin transport and spin precession in single graphene layers at room temperature, Nature, Aug. 2, 2007, p. 571-575, vol. 448.

Hideaki Ohnishi et al., Quantized conductance through individual rows of suspended gold atoms, Nature, Oct. 22, 1998, p. 780-783, vol. 395.

Yihan Shao et al., Advances in methods and algorithms in a modern quantum chemistry program package, Phys. Chem. Chem. Phys., 2006, p. 3172-3194, vol. 8.

Chengteh Lee et al., Development of the Colle-Salvetti correlation-energy formula into a functional of the electron density, Physical Review B, Jan. 15, 1988-I, p. 785-789, vol. 37, No. 2.

Hiroshi Yasuda et al., Conductance of atomic-scale gold contacts under hgih-bias voltages, Physical Review B, Jul. 15, 1997-I, p. 1069-1072, vol. 56, No. 3.

Katsuhiro Itakura et al., Bias dependence of the conductance of Au nanocontacts, Physical Review B, Oct. 15, 1999-I, p. 11 163-170, vol. 60, No. 15.

Francesca Moresco et al., Conformational Changes of Single Molecules Induced by Scanning Tunneling Microscopy Manipulation: A Route to Molecular Switching, Physical Review Letters, Jan. 22, 2001, p. 672-675, vol. 86, No. 4.

Ch. Loppacher et al., Direct Determination of the Energy Required to Operate a Single Molecule Switch, Physical Review Letters, Feb. 14, 2003, p. 066107-1-4, vol. 90, No. 6.

Jascha Repp et al., Molecules on Insulating Films: Scanning-Tunneling Microscopy Imaging of Individual Molecular Orbitals, Physical Review Letters, Jan. 21, 2005, p. 026803-1-4. vol. 94.

Th. Frauenheim (a) et al., A Self-Consistent Charge Density-Functional Based Tight-Binding Method for Predictive Materials Simulations in Physics, Chemistry and Biology, Phys. Stat. Sol., 2000, p. 41-62, vol. 217, No. 41.

Geoffrey J. Ashwell et al., Molecules that mimic Schottky diodes, Physical Chemistry Chemical Physics, 2006, p. 3314-3319, vol. 8.

Chun Zhang et al., Current-voltage characterisitics through a single light-sensitive molecule, Physical Review B, 2006, p. 125445-1-5, vol. 73.

D. Porezag et al., Construction of tight-binding-like potentials on the basis of density-functional theory: Application to carbon, Physical Review B, May 15, 1995-I, p. 12 947-957, vol. 51, No. 19.

M. Elstner et al., Self-consistent-charge density-functional tight-binding method for simulations of complex materials properties, Physical Review B, Sep. 15, 1998-I, p. 7260-7268, vol. 58, No. 11.

Jeremy Taylor et al., Ab initio modeling of quantum transport properties of molecular electronic devices, Physical Review B, 2001, p. 245407-1-13, vol. 63.

Mads Brandbyge et al., Density-functional method for nonequilibrium electron transport, Physical Review B, 2002, p. 165401-1-17, vol. 65.

Gavin D. Scott et al., Mechanism of enhanced rectification in unimolecular Borromean ring devices, Physical Review B, 2006, p. 113404-1-4, vol. 74.

O.D. Miller et al., Rectification by charging: Contact-induced current asymmetry in molecular conductors, Physical Review B, 2008, p. 125427-1-10, vol. 77.

J. Reichert et al., Driving Current through Single Organic Molecules, Physical Review Letters, Apr. 29, 2002, p. 176804-1-4, vol. 88, No. 17.

N. B. Zhitenev et al., Conductance of Small Molecular Junctions, Physical Review Letters, Jun. 3, 2002, p. 226801-1-4, vol. 88, No. 22.

Christian Joachim et al., Molecular electronics: Some views on transport junctions and beyond, PNAS, Jun. 21, 2005, p. 8801-8808, vol. 102, No. 25.

Mark Elbing et al., A single-molecule diode, PNAS, Jun. 21, 2005, p. 8815-8820, vol. 102, No. 25.

Alessandro Pecchia et al., Atomistic theory of transport in organic and inorganic nanostructures, Rep. Prog. Phys., 2004, p. 1497-1561, vol. 67.

Yablonovitch, E. The chemistry of solid-state electronics, Science, 1989, p. 347-351, 246.

Flood, Amar H. et al., Chemistry: Enhanced: Whence Molecular Electronics? Science 2004, p. 2055-2056, 306.

Peter Liljeroth et al., Current-Induced Hydrogen Tautomerization and Conductance Switching of Naphthalocyanine Molecules, Science, Aug. 31, 2007, p. 1203-1206, vol. 317.

Michael Galperin et al., Nuclear Coupling and Polarization in Molecular Transport Junctions: Beyond Tunneling to Function, Science, Feb. 22, 2008, p. 1056-1060, vol. 319.

Rik R. Tykwinski et al., Cross-Conjugated oligo(enynes), Synlett, 2002, p. 1939-1953, No. 12.

F. Zahid et al., A self-consistent transport model for molecular conduction based on extended Huckel theory with full three-dimensional electrostatics, The Journal of Chemical Physics, 2005, p. 064707-1-10, vol. 123.

Gemma C. Solomon et al., Understanding quantum interference in coherent molecular conduction, The Journal of Chemical Physics, 2008, 054701-1-8, vol. 129.

* cited by examiner (a)

(b)

(c)

MOLECULAR QUANTUM INTERFERENCE APPARATUS AND APPLICATIONS OF SAME

CROSS-REFERENCE TO RELATED PATENT APPLICATION

This application claims the priority to and benefit of, pursuant to 35 U.S.C. §119(e), U.S. provisional patent application Ser. No. 61/014,563, filed Dec. 18, 2007, entitled "MOLECULAR QUANTUM INTERFERENCE APPARATUS AND APPLICATIONS OF SAME," by Solomon et al., which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

STATEMENT OF FEDERALLY-SPONSORED RESEARCH

This invention was made with government support under grant numbers FA8650-06-C-7617 and F49620-02-1-0381, awarded by the Air Force Office of Sponsored Research; grant number FA9550-06-1-0558, awarded by the Department of Defense/Air Force Office of Sponsored Research; grant number N00014-05-1-0021, awarded by the Office of Naval Research of the United States; grant numbers CHE-0719420, 4101-19917/EEC-0634750, DMR-0520513, 501-0791-04/EEC-0228390, and CHE-0414554, awarded by the National Science Foundation. The government has certain rights in the invention.

FIELD OF THE INVENTION

The present invention is generally related to the field of molecular electronics, and more particularly, is related to molecular quantum interference apparatus in which electrical conduction is affected by quantum interference, and applications of same.

BACKGROUND OF THE INVENTION

Recent technology developments have resulted in miniaturization of electronic devices. Further miniaturization of electronic devices, however, will require fundamental advances in people's approach to building and designing electronic components. Molecular electronics provides such a frontier and is partly driven by the goal of producing active electronic elements that rival the performance of their solid-state counterparts, but on a much smaller size scale. Electron transfer[1-3] is of fundamental importance in broad areas of research encompassing both natural[4] and artificial systems.[5] Using molecules as discrete electronic elements was initiated by the proposal of a single molecule rectifier.[6] Since this proposal, a number of single molecule electronic devices have been constructed with varied behavior[7] including switching,[8] rectification,[9-11] coulomb blockade,[12] Kondo resonance,[12] negative differential resistance (NDR),[13] and memory elements.[14] A number of measurements have established single molecule transistor behavior in UHV conditions,[15-19] as well as using electrochemical gate control.[20-24]

For single molecule switches, there are a number of theoretical studies on how molecular conformational change can lead to large conductance changes,[25,26] including measurements using photochromic molecules.[27] Many methods for creating molecular switches rely on, or result in, conformational change to the molecule of interest.[28-30] For fast and reproducible switching, and integration in useful devices, switching should not result in conformational change. Recent work has highlighted how this can be accomplished with hydrogen transfer in a naphthalocyanine molecule at low temperature, resulting in an on/off ratio of 2.[8]

All of the molecular devices proposed and measured to date hint at the wide variety of electronic functions that can be completed within a single molecule.[31] Major drawbacks in comparison with solid state devices include the low dynamic range in transport through single molecules and in the vibronic mechanisms[29] that result in slow switching speed. A recent proposed molecular-based device attempts to reducing destructive quantum interference, which however is a much desired feature for a wide range of molecular devices such as molecular-based insulator, molecular-based rectifier, etc.

Therefore, a heretofore unaddressed need exists in the art to address the aforementioned deficiencies and inadequacies.

SUMMARY OF THE INVENTION

In one aspect, the present invention relates to a molecular quantum interference device for use in molecular electronics. In one embodiment, the device includes a molecular quantum interference unit having a first terminal group and a second terminal group between which quantum interference affects electrical conduction, a molecular spacer having a first terminal group and a second terminal group and coupled to the molecular quantum interference unit through a chemical bonding between the first terminal group of the molecular spacer and the second terminal group of the molecular quantum interference unit, a first electrode electrically coupled to the molecular quantum interference unit and configured to supply charge carriers to or receive charge carriers from the molecular quantum interference unit, and a second electrode electrically coupled to the molecular spacer and configured to receive charge carriers from or supply charge carriers to the molecular spacer.

The molecular quantum interference unit comprises one selected from the group of a cross-conjugated unit, a meta substituted phenyl ring, a substituted cyclic system that is not a phenyl ring, and a π-stacked unit. The cross-conjugated unit can be a cyclic or acyclic cross-conjugated unit.

The molecular spacer comprises one selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. In one embodiment, the chemical bonding between the first terminal group of the molecular spacer and the second terminal group of the molecular quantum interference unit comprises a carbon-carbon single bond.

Each of the first and second electrodes comprises a material having a work function for electron tunneling between the first and second electrodes, respectively, through the molecular spacer and the molecular quantum interference unit. In one embodiment, each of the first and second electrodes comprises an electrically conducting or semi-conducting material. For examples, each of the first and second electrodes comprises at least one of gold, copper, platinum, palladium, silver, silicon, graphene, carbon nanotubes, iridium, ITO and doped semiconductor materials.

In one embodiment, the first electrode is electrically coupled to the molecular quantum interference unit through a chemical bonding, wherein the chemical bonding is formed by one or more molecules in or near a surface of the first electrode being chemisorbed with at least a part of the first terminal group of the molecular quantum interference unit through chemical reacting with the one or more molecules in or near the surface. In another embodiment, the first electrode is electrically coupled to the molecular quantum interference unit through a non-chemical bonding.

In one embodiment, the second electrode is electrically coupled to the molecular spacer through a chemical bonding, wherein the chemical bonding is formed by one or more molecules in or near a surface of the second electrode being chemisorbed with at least a part of the second terminal group of the molecular spacer through chemical reacting with the one or more molecules in or near the surface. In another embodiment, the second electrode is electrically coupled to the molecular spacer through a non-chemical bonding.

In one embodiment, a current source is electrically coupled to at least one of the first electrode and the second electrode for establishing a bias current or voltage across the first electrode and the second electrode, wherein when a bias current or voltage is established across the first electrode and the second electrode, a transmission spectrum is measurable between the first electrode and the second electrode and variable with the bias voltage.

In another aspect, the present invention relates to a molecular quantum interference device for use in molecular electronics. In one embodiment, the device includes at least one molecular quantum interference unit having a first terminal group and a second terminal group between which quantum interference affects electrical conduction; at least two molecular spacers, each having a first terminal group and a second terminal group, wherein a first one of the at least two molecular spacers is coupled to the molecular quantum interference unit through a chemical bonding between the first terminal group of the first molecular spacer and the second terminal group of the molecular quantum interference unit, and a second one of the two molecular spacers is coupled to the molecular quantum interference unit through a chemical bonding between the second terminal group of the second molecular spacer and the first terminal group of the molecular quantum interference unit, respectively; a first electrode electrically coupled to the second molecular spacer; and a second electrode electrically coupled to the first molecular spacer.

The molecular quantum interference unit comprises one selected from the group of a cross-conjugated unit, a meta substituted phenyl ring, a substituted cyclic system that is not a phenyl ring, and a π-stacked unit, wherein the cross-conjugated unit comprises a cyclic or acyclic cross-conjugated unit.

Each of the at least two molecular spacers comprises one selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. In one embodiment, each of the chemical bonding between the first terminal group of the first molecular spacer and the second terminal group of the molecular quantum interference unit, and the chemical bonding between the second terminal group of the second molecular spacer and the first terminal group of the molecular quantum interference unit comprises a carbon-carbon single bond.

Each of the first and second electrodes comprises a material having a work function for electron tunneling between the first and second electrodes, respectively, through the molecular spacers and the molecular quantum interference unit. In one embodiment, each of the first and second electrodes comprises an electrically conducting or semi-conducting material. For examples, each of the first and second electrodes comprises at least one of gold, copper, platinum, palladium, silver, silicon, graphene, carbon nanotubes, iridium, ITO and doped semiconductor materials.

In one embodiment, at least one of the first electrode and the second electrode is electrically coupled to a corresponding molecular spacer through a chemical bonding. In another embodiment, at least one of the first electrode and the second electrode is electrically coupled to a corresponding molecular spacer through a non-chemical bonding.

In one embodiment, a current source is electrically coupled to at least one of the first electrode and the second electrode for establishing a bias current or voltage across the first electrode and the second electrode, wherein when a bias current or voltage is established across the first electrode and the second electrode, a transmission spectrum is measurable between the first electrode and the second electrode and variable with the bias voltage.

In another embodiment, the at least two molecular spacers comprise at least one more spacer coupled between the molecular quantum interference unit and one of the first electrode and the second electrode.

In yet another aspect, the present invention relates to a molecular quantum interference device for use in molecular electronics. In one embodiment, the device includes at least one molecular spacer having a first terminal group and a second terminal group; at least two molecular quantum interference units, each having a first terminal group and a second terminal group between which quantum interference affects electrical conduction, wherein a first one of the at least two molecular quantum interference units is coupled to the at least one molecular spacer through a chemical bonding between the first terminal group of the at least one molecular spacer and the second terminal group of the first molecular quantum interference unit, and a second one of the at least two molecular quantum interference units is coupled to the at least one molecular spacer through a chemical bonding between the second terminal group of the at least one molecular spacer and the first terminal group of the second molecular quantum interference unit, respectively; a first electrode electrically coupled to the first molecular quantum interference unit; and a second electrode electrically coupled to the second molecular quantum interference unit.

Each of the at least two molecular quantum interference units comprises one selected from the group of a cross-conjugated unit, a meta substituted phenyl ring, a substituted cyclic system that is not a phenyl ring, and a π-stacked unit, wherein the cross-conjugated unit comprises a cyclic or acyclic cross-conjugated unit.

The at least one molecular spacer comprises one selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. In one embodiment, each of the chemical bonding between the first terminal group of the at least one molecular spacer and the second terminal group of the first molecular quantum interference unit, and the chemical bonding between the second terminal group of the at least one molecular spacer and the first terminal group of the second molecular quantum interference unit comprises a carbon-carbon single bond.

Each of the first and second electrodes comprises a material having a work function for electron tunneling between the first and second electrodes, respectively, through the at least one molecular spacer and the at least two molecular quantum interference units. In one embodiment, each of the first and second electrodes comprises an electrically conducting or semi-conducting material. For examples, each of the first and second electrodes comprises at least one of gold, copper, platinum, palladium, silver, silicon, graphene, carbon nanotubes, iridium, ITO and doped semiconductor materials.

In one embodiment, at least one of the first electrode and the second electrode is electrically coupled to a corresponding molecular quantum interference unit through a chemical bonding. In another embodiment, at least one of the first electrode and the second electrode is electrically coupled to a corresponding molecular quantum interference unit through a non-chemical bonding.

In one embodiment, a current source is electrically coupled to at least one of the first electrode and the second electrode for establishing a bias current or voltage across the first electrode and the second electrode, wherein when a bias current or voltage is established across the first electrode and the second electrode, a transmission spectrum is measurable between the first electrode and the second electrode and variable with the bias voltage.

In one embodiment, the at least one molecular spacer comprises at least two molecular spacers coupled between the at least two molecular quantum interference units or between one of the first electrode and the second electrode and one of the at least two molecular quantum interference units.

In another embodiment, the at least two molecular quantum interference units comprise at least one more molecular quantum interference unit coupled between the at least one molecular spacer and one of the first electrode and the second electrode.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
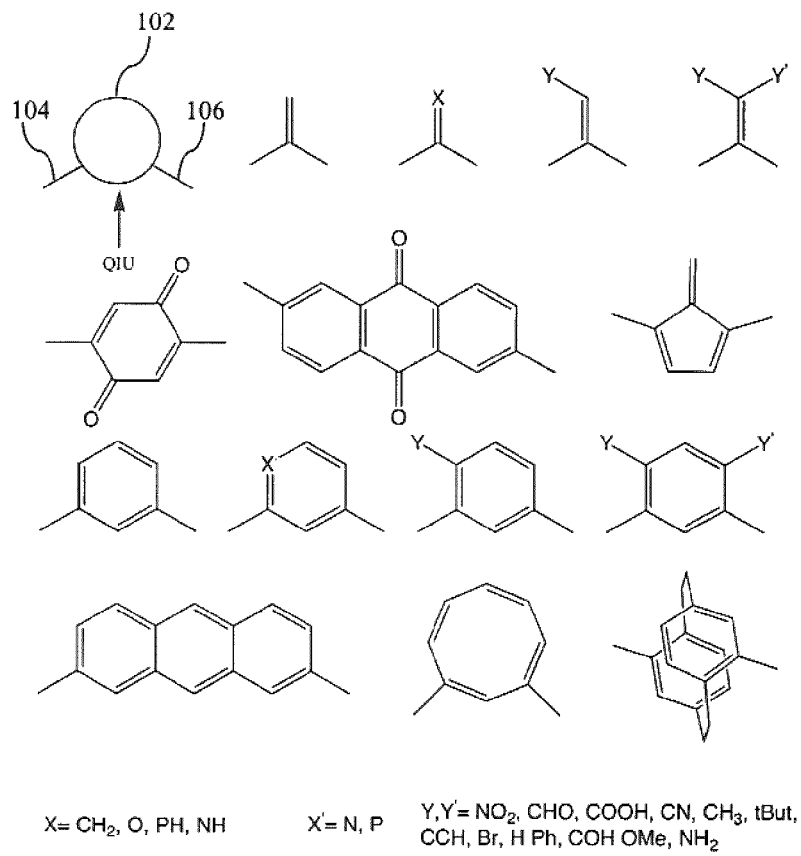
FIG. 1 shows examples of a QIU, the systems in the first row are acyclic cross-conjugated units and the second row are cyclic cross-conjugated systems, which can be used in various embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "conjugated" shall generally mean a system of alternating single and double bonds.

A cross-conjugated compound is in general defined as a compound possessing three unsaturated groups, two which are although conjugated to a third unsaturated center are not conjugated to each other." (Phelan & Orchin, 1968.) As used herein, "a cross-conjugated compound" includes molecules where only the third of the saturated centers mentioned above is present. In that case, the other two unsaturated centers are replaced by saturated units, however the central core remains.

As used herein, "cross-conjugated unit (CCU)" shall generally mean a cross-conjugated component in a molecule. A cross-conjugated unit can be a cyclic or acyclic cross-conjugated unit.

As used herein, "π-stacked unit (PCU)" shall generally mean a component of a molecule comprising multiple conjugated components tethered in a π-stacked orientation.

As used herein, "quantum interference unit (QIU)" shall generally mean a component of a molecule that comprises at least one cross-conjugated unit, oriented within a molecule so that the cross-conjugated path exists along the direction of charge flow, a meta substituted phenyl ring, a substituted cyclic system that is not a phenyl ring, and/or a π-stacked unit. The cross-conjugated unit can be a cyclic or acyclic cross-conjugated unit. FIG. 1 provides a generic QIU 102 in general, where the QIU 102 has a first terminal group 104 and a second terminal group 106 between which quantum interference affects electrical conduction, and several QIU examples in specific, where for instances in the first row are acyclic cross-conjugated units-based QIUs and in the second row are cyclic cross-conjugated units-based QIUs.

Figure 2:
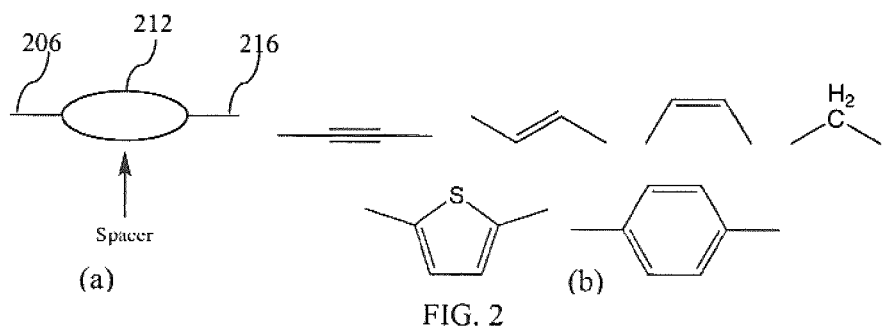
FIG. 2 shows examples of a spacer, which can be used in various embodiments of the present invention.

As used herein, "spacer" shall generally mean a component of a molecule that comprises a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. FIG. 2 provides a generic spacer 212 in general, where the spacer 212 has a first terminal group 206 and a second terminal group 216 that each can be coupled to and/or with a QIU or an electrode, and several spacer examples in specific.

As used herein, "chemical bonding" shall generally mean the property that atoms posses of joining together to form molecules, and can take various forms, including ionic bonding, covalent bonding and metallic bonding.

OVERVIEW OF THE INVENTION

In one aspect of the invention, it relates to one or more molecular electronic devices such as a molecular quantum interference apparatus, which has a functional component that comprises active molecules, molecules with at least one quantum interference unit.

Figure 3:
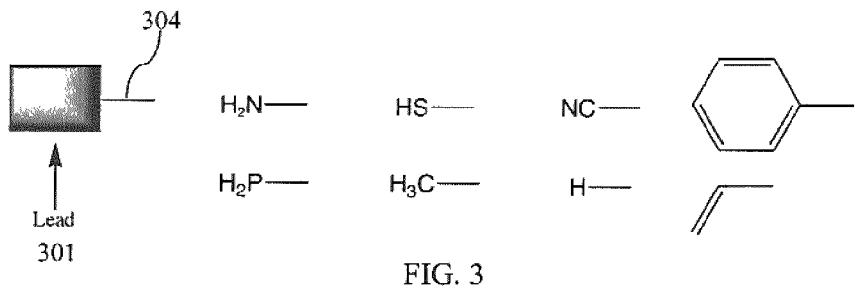
FIG. 3 shows examples of end groups, which can be used in various embodiments of the present invention.
Figure 4:
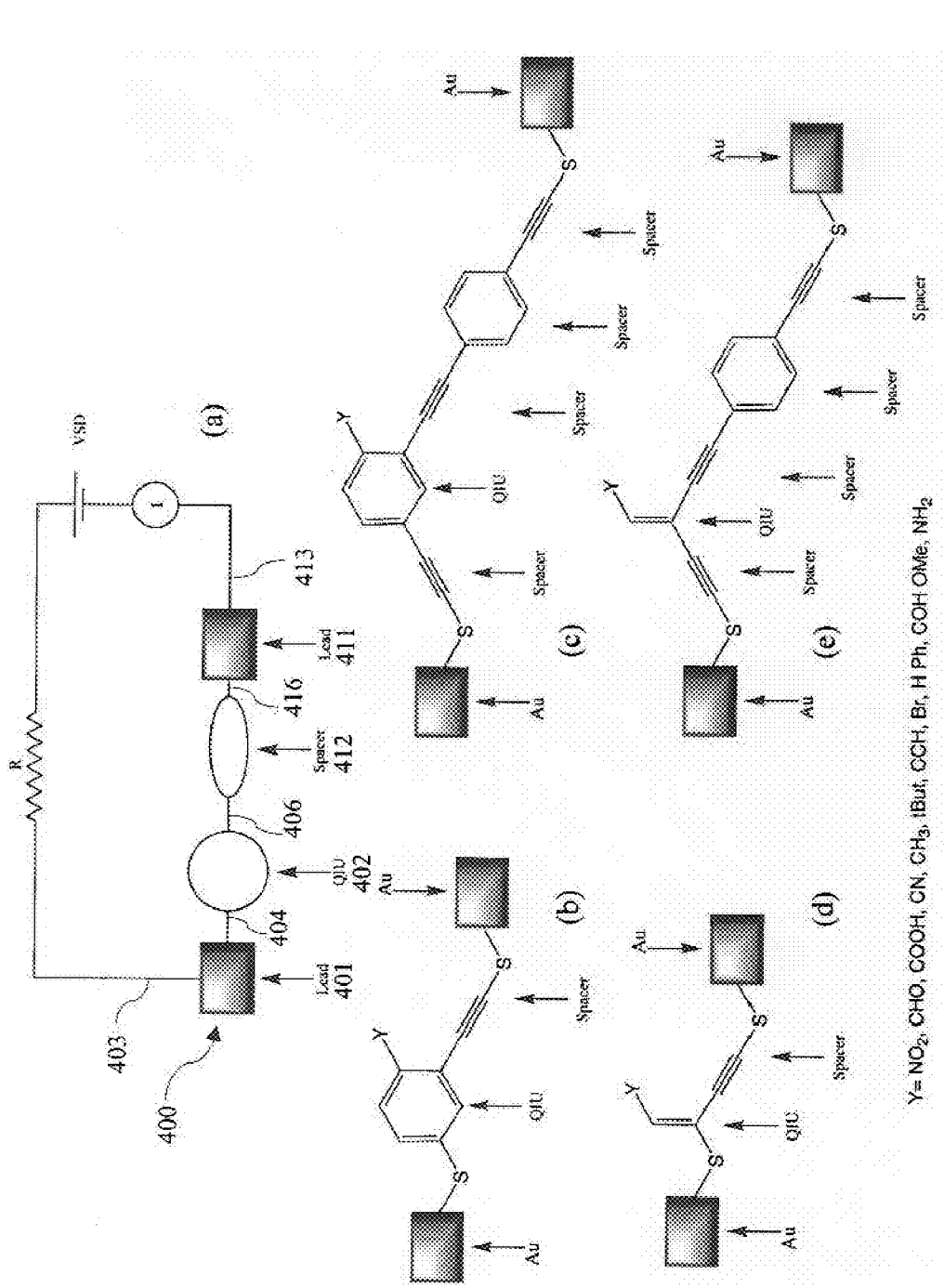
FIG. 4 shows systems that could produce transmission according to various embodiments of the present invention. The systems in the third row are examples of cross-conjugated units being used as the quantum interference unit.
Figure 5:
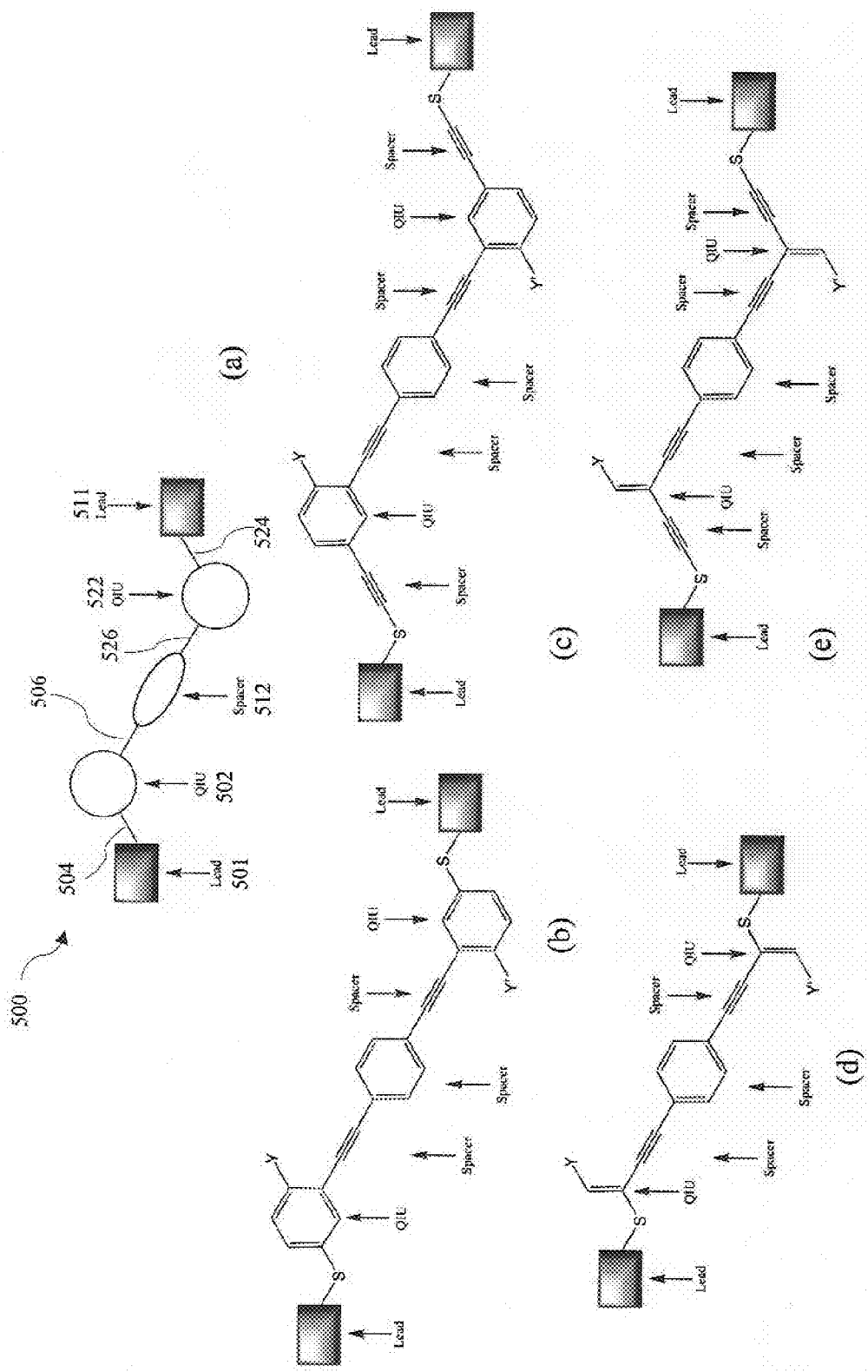
FIG. 5 shows systems that could produce transmission according to various embodiments of the present invention. The systems in the third row are examples of cross-conjugated units being used as the quantum interference unit.

The description will be made as to the embodiments of the present invention in conjunction with the accompanying drawings of FIGS. 1-18. In accordance with the purposes of this invention, as embodied and broadly described herein, this invention, in one aspect, relates to a molecular quantum interference device for use in molecular electronics. In one embodiment as shown in FIG. 4(a), where such a device 400 is illustrated, the device 400 includes a molecular quantum interference unit 402 having a first terminal group and a second terminal group between which quantum interference affects electrical conduction. The device 400 further has a molecular spacer 412 having a first terminal group and a second terminal group. The molecular spacer 412 is coupled to the molecular quantum interference unit 402 through a chemical bonding 406 between the first terminal group of the molecular spacer 412 and the second terminal group of the molecular quantum interference unit 402. Moreover, the device 400 has a first electrode 401 electrically coupled to the molecular quantum interference unit 402 and configured to supply charge carriers to or receive charge carriers from the molecular quantum interference unit 402, and a second electrode 411 electrically coupled to the molecular spacer 412 and configured to receive charge carriers from or supply charge carriers to the molecular spacer 412, respectively.

The molecular quantum interference unit 402 is a compound selected from the group of a cross-conjugated unit, a meta substituted phenyl ring, a substituted cyclic system that is not a phenyl ring, and a π-stacked unit. The cross-conjugated unit can be a cyclic or acyclic cross-conjugated unit.

The molecular spacer 412 is a compound selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. In one embodiment, the chemical bonding between the first terminal group of the molecular spacer 412 and the second terminal group of the molecular quantum interference unit 402 is a carbon-carbon single bond.

Each of the first and second electrodes 401, 411 is made from a material having a work function for electron tunneling between the first and second electrodes 401, 411, respectively, through the molecular spacer 412 and the molecular quantum interference unit 412. In one embodiment, each of the first and second electrodes 401, 411 is made from an electrically conducting or semi-conducting material. For examples, each of the first and second electrodes 401, 411 can be made from at least one of gold, copper, platinum, palladium, silver, silicon, graphene, carbon nanotubes, iridium, ITO and doped semiconductor materials. In terms of physics, the work function of the material is related to $E-E_f$, where E is the energy of the electron, and $E_F$ is the Fermi level ($E_F$) of the material from which the first and second electrodes 401, 411 is made In one embodiment, the first electrode 401 is electrically coupled to the molecular quantum interference unit 402 through a chemical bonding 404, wherein the chemical bonding 404 is formed by one or more molecules in or near a surface of the first electrode 401 being chemisorbed with at least a part of the first terminal group of the molecular quantum interference unit 402 through chemical reacting with the one or more molecules in or near the surface of the first electrode 401 that is facing and interacting with the first electrode 401. Alternatively, the first electrode 401 can be electrically coupled to the molecular quantum interference unit 402 through a non-chemical bonding.

Similarly, in one embodiment, the second electrode 411 is electrically coupled to the molecular spacer 412 through a chemical bonding 416, wherein the chemical bonding 416 is formed by one or more molecules in or near a surface of the second electrode 411 being chemisorbed with at least a part of the second terminal group of the molecular spacer 412 through chemical reacting with the one or more molecules in or near the surface that is facing and interacting with the second electrode 411. Alternatively, the second electrode 411 can be electrically coupled to the molecular spacer 412 through a non-chemical bonding.

The chemical bonding between an electrode and a molecular quantum interference unit or a molecular spacer can be realized by many ways, as known to people skilled in the art. For example, a thiol group loses its terminal hydrogen and the sulfur atom is chemically bound to a gold surface, or an ethylene group reacts with dangling bonds on a silicon surface resulting in carbon-silicon bonds. Additional examples of end groups on a molecular quantum interference unit or a molecular spacer that could be used for interaction with an electrode are shown in FIG. 3.

In the case of a non-chemical bonding such as a physical interaction between an electrode and a molecular quantum interference unit or a molecular spacer, non-bonding interactions bind the molecular quantum interference unit or the molecular spacer to a corresponding electrode, either directly, with the molecules interacting through space with the surface of the corresponding electrode, or indirectly through an interaction with some sort of capping layer on the surface of the corresponding electrode.

In one embodiment, a current source is electrically coupled to the first electrode 401 (through conducting line 403) and the second electrode 411 (through conducting line 413) for establishing a bias current or voltage (VSD) across the first electrode 401 and the second electrode 411, wherein when a bias current or voltage VSD is established across the first electrode 401 and the second electrode 413, a transmission spectrum such as an I-V curve is measurable between the first electrode 401 and the second electrode 411 and variable with the bias voltage VSD. Exemplary I-V curves of molecular quantum interference devices according to various embodiments of the present invention are further described below in connection with drawings, for examples, FIG. 6, FIG. 9 and FIG. 10.

A molecular quantum interference device of the present invention can have one or more molecular spacers. The molecular spacers can be same or different. In embodiments as shown in FIG. 4(c) and FIG. 4(e), where such devices are illustrated with electrodes made from gold (Au), such a device includes at least one molecular quantum interference unit having a first terminal group and a second terminal group between which quantum interference affects electrical conduction. The device has at least two molecular spacers: each of them has a first terminal group and a second terminal group, wherein a first one of the at least two molecular spacers is coupled to the molecular quantum interference unit through a chemical bonding between the first terminal group of the first molecular spacer and the second terminal group of the molecular quantum interference unit, and a second one of the two molecular spacers is coupled to the molecular quantum interference unit through a chemical bonding between the second terminal group of the second molecular spacer and the first terminal group of the molecular quantum interference unit, respectively. The device has a first electrode (such as the one positioned in the left as shown in FIGS. 4(c) and 4(e)) electrically coupled to the second molecular spacer, and a second electrode (such as the one positioned in the right as shown in FIGS. 4(c) and 4(e)) electrically coupled to the first molecular spacer. For the device shown in FIG. 4(c), there are one molecular quantum interference unit and four molecular spacers positioned between the first and second electrodes. Between an electrode and a molecular quantum interference unit, there can be one or more molecular spacers.

Similarly, a molecular quantum interference device of the present invention can have one or more molecular quantum interference units. The molecular quantum interference units can be same or different. Moreover, as shown in FIGS. 5(a)-(e), molecular quantum interference devices of the present invention can have one or more molecular quantum interference units, which can be same or different, with one or more molecular spacers, which also can be same or different. This flexbility to have a molecular quantum interference device with a desired combination of a plurality of molecular quantum interference units and a plurality of molecular spacers offered by the present invention allows a wide range of design choices and hence many applications of the molecular quantum interference device in molecular electronics.

In one embodiment as shown in FIG. 5(a), a device 500 includes at least one molecular spacer 512 that has a first terminal group and a second terminal group. The device 500 has two molecular quantum interference units 502, 522, each having a first terminal group and a second terminal group between which quantum interference affects electrical conduction. A first one, here molecular quantum interference unit 502, of the two molecular quantum interference units 502, 522 is coupled to the molecular spacer 512 through a chemical bonding 506 between the first terminal group of the molecular spacer 512 and the second terminal group of the first molecular quantum interference unit 502, and a second one 522, here molecular quantum interference unit 522, of the two molecular quantum interference units 502, 522 is coupled to the at least one molecular spacer 512 through a chemical bonding 526 between the second terminal group of the at least one molecular spacer 512 and the first terminal group of the second molecular quantum interference unit 522, respectively. A first electrode 501 is electrically coupled to the first molecular quantum interference unit 502, and a second electrode 511 is electrically coupled to the second molecular quantum interference unit 522, respectively.

Each of the two molecular quantum interference units 502, 522 is a compound selected from the group of a cross-conjugated unit, a meta substituted phenyl ring, a substituted cyclic system that is not a phenyl ring, and a π-stacked unit, wherein the cross-conjugated unit can be a cyclic or acyclic cross-conjugated unit. Molecular quantum interference units 502, 522 can be same or different.

The molecular spacer 512 is a compound selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them. In one embodiment, each of the chemical bonding 506 between the first terminal group of the molecular spacer 512 and the second terminal group of the first molecular quantum interference unit 502, and the chemical bonding 526 between the second terminal group of the molecular spacer 512 and the first terminal group of the second molecular quantum interference unit 522 is a carbon-carbon single bond.

In one embodiment as shown in FIG. 5(b), a molecular quantum interference device of the present invention has three molecular spacers coupled between two molecular quantum interference units, which are positioned between a first electrode and a second electrode.

In another embodiment as shown in FIG. 5(c), a molecular quantum interference device of the present invention has five molecular spacers and two molecular quantum interference units, which are positioned between a first electrode and a second electrode with three molecular spacers between the first and second electrodes.

In yet another embodiment as shown in FIG. 5(d), a molecular quantum interference device of the present invention has three molecular spacers coupled between two molecular quantum interference units, which are positioned between a first electrode and a second electrode, and each of which is a cross-conjugated unit.

In a further embodiment as shown in FIG. 5(e), a molecular quantum interference device of the present invention has five molecular spacers and two molecular quantum interference units, which are positioned between a first electrode and a second electrode with three molecular spacers between the first and second electrodes. Each of the two molecular quantum interference units is a cross-conjugated unit.

A molecular quantum interference device of the present invention can be used as an insulator, a molecular switch, a memory device, a transistor, a diode, a rectifier, a dielectric and a sensor, among other things.

Without intent to limit the scope of the invention, additional exemplary embodiment and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as data are processed, sampled, converted, or the like according to the invention without regard for any particular theory or scheme of action.

EXAMPLES

While there has been shown several and alternate embodiments of the present invention, it is to be understood that certain changes can be made as would be known to one skilled in the art without departing from the underlying scope of the invention as is discussed and set forth above. Furthermore, the embodiments described above are only intended to illustrate the principles of the present invention and are not intended to limit the scope of the invention to the disclosed elements.

Example 1

Figure 11:
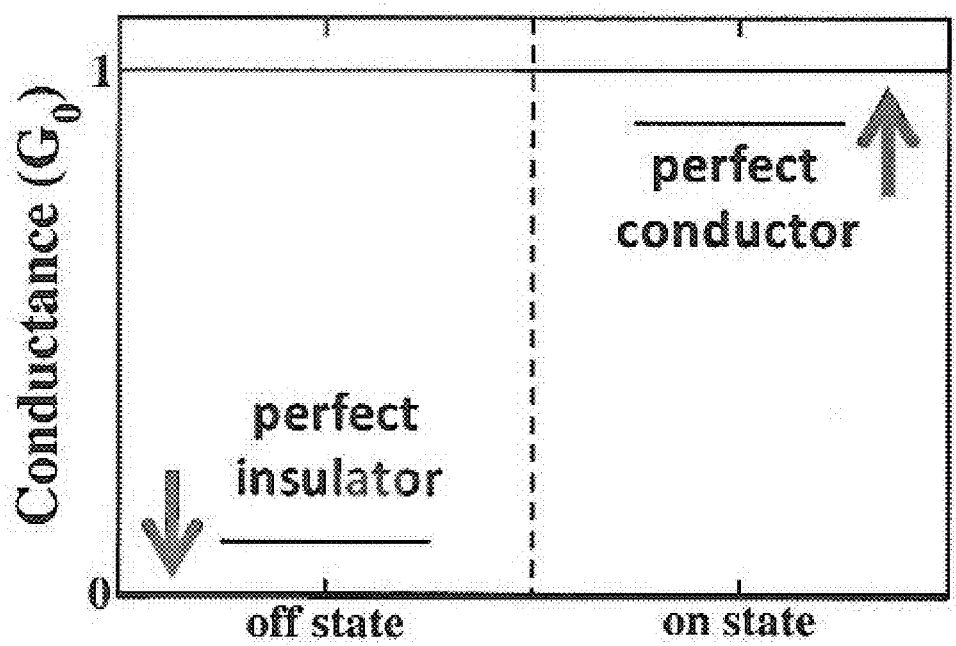
FIG. 11 shows that in an ideal switch the off state would be a perfect insulator (lower line at 0 $G_0$) and the on state would be a perfect conductor (upper line at 1 $G_0$). In a single transport channel, ballistic transport through a perfect conductor representing the on state is one $G_0$, the quantum of conductance (~12.91 KΩ)$^{-1}$.
Figure 12:
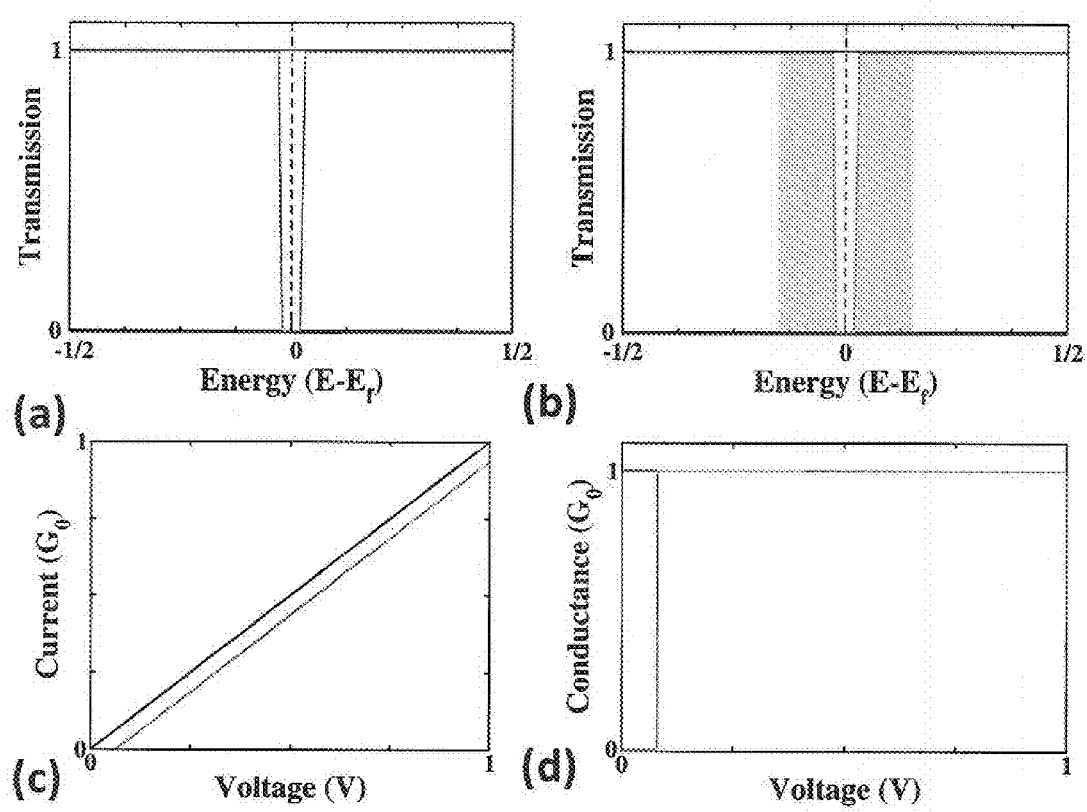
FIG. 12 shows schematically the transmission and current/voltage behavior of a voltage switch, where the conductance goes from 0 to ~1 $G_0$ as a function of voltage. The red line represents a Au wire and the green line represents the molecule of interest. In (a), the transmission plot for a potential device is shown in solid line having an off state at and near $E=E_f$ and on state at all other energies. (b) To calculate the current and conductance of (a), the transmission plot (assuming invariance to applied voltage) is integrated between the chemical potentials of the leads, shown as the shaded region. (c) shows the current/voltage behavior realized by integrating the transmission plot in (b). The conductance as a function of voltage is shown in (d).
Figure 13:
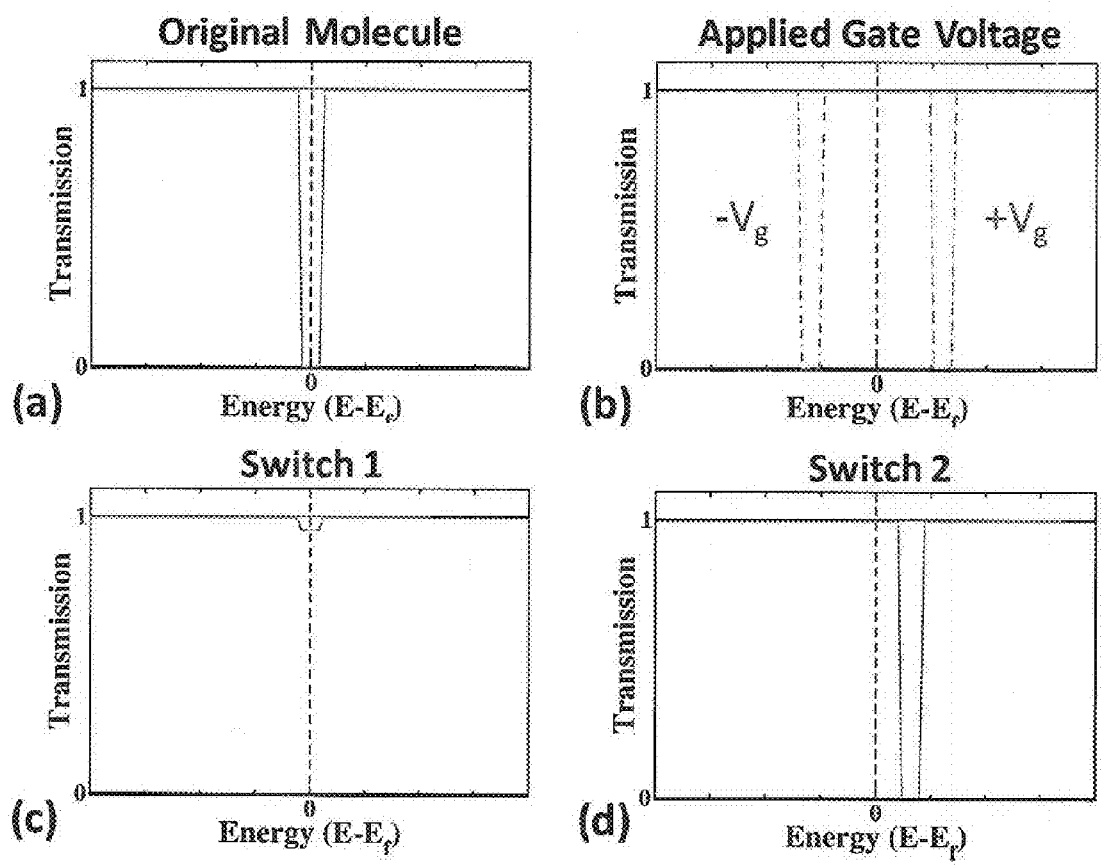
FIG. 13 shows the transmission of a proposed molecule with distinct on and off states is shown again as the solid line in (a). In plots (b), (c), and (d) the molecule has been switched in three different ways from a low conductance state to a high conductance state at low bias voltage. In (b) it shows a situation where an applied gate voltage might shift the dip in the transmission spectrum away from the Fermi energy shown as the two dashed lines, respectively. In (c) a large change in the molecule occurs causing the transmission to drastically change. (d) A molecular interaction event or change in electron density in the molecule could shift the transmission spectrum.

In designing a single molecule electronic device, it is helpful to ask what transport behavior is necessary for a molecule to function as an ideal transistor (switch), memory element, or a chemical sensor. In this exemplary embodiment of the present invention, a molecular switch is described. FIG. 11 shows the conductance of such a single-channel device with a well defined on state and off state. The line at a lower position indicates a perfect insulator. The line at 1 $G_0$ indicates a perfect conductor representing ballistic single-channel transport, where the probability of back electron scattering within the molecule is zero. This limit of 1 $G_0$, is a direct result from quantum theory,[36,37] which has been measured in chains of Au atoms[38,39] at high bias of 2 Volts,[40,41] and has been verified in computational calculations[42,43] With the upper and lower bounds of conductance defined by a perfect conductor and a perfect insulator, it seems trivial that a perfect switch would be a perfect insulator in the off state and a perfect conductor in the on state as shown in FIG. 11. All molecules, which have a non-constant transmission probability as a function of energy, can be considered a switch or transistor (because a change in bias or gate voltage leads to a change in conductance). An ideal switch would need to satisfy the following requirements: (1) an infinite ratio of the on current/off current ($I_{on}/I_{off}$), (2) a subthreshold swing[44] of 0 mV/decade indicating a switch that abruptly changes from the off state to the on state at a defined threshold voltage, (3) fast switching times that do not rely on nuclear motion but only changes in the relative electron density, (4) reproducibility and stability[29] by minimizing charging and geometric organization, and (5) low bias operation, energetically separated from a molecular resonance. While many other factors including leakage current, threshold voltage, and cost are extremely important, following discussion is focused on the five criteria listed above, specifically the $I_{on}/I_{off}$ ratio and the subthreshold swing.

Example 2

In this exemplary embodiment of the present invention, how the conductance through a molecule can switch as a function of voltage is discussed. In a two-probe single molecule junction, measurements are limited to the current as a function of voltage, along with the derivative and second derivative of the data. In charge transport calculations, we determine the transmission probability of an incident electron as a function of energy. Integration of the transmission probability over the range of chemical potentials of the left and right leads will give the current.[37] The transmission plots provide more detail on the molecular causes of the I/V characteristics; therefore, the following discussion is focused on understanding and controlling the electron transmission probability.

In FIG. 12(a), the transmission through a perfect conductor is shown in red, a perfect insulator in blue, and a candidate for a molecular switch in green. This hypothetical molecule behaves as a voltage switch where it is a perfect insulator near $E_f$ with a transmission probability is equal or ~0, and a perfect conductor at all other energies. FIG. 12(b) is the same plot with the shaded area representing a discrete bias voltage applied across the molecular switch (assuming the bias shifts the chemical potentials symmetrically about $E_f$). The current is calculated by integrating the area under the transmission and is shown in FIG. 12(c). In FIG. 12(d), the conductance as a function of voltage is shown. In FIG. 12(d), the hypothetical molecule is switching from a low conductance state at low bias voltage to a high conductance state at high bias voltage.

Example 3

In this exemplary embodiment of the present invention, having demonstrated what represents an ideal transmission function for a single molecule with on and off states, how this transmission function can be manipulated to achieve switching behavior is described. In a three terminal measurement, the maximum $I_{on}/I_{off}$ ratio for a specific molecule is defined as the transmission probability at the energetically closest frontier molecular orbital/the transmission probability at the Fermi level.[44] When the incident electron energy corresponds to a molecular resonance, the elastic transmission probability is equal to or ~1. To get a large dynamic range, one needs to have molecular systems where the transmission probability also goes to zero. A molecular insulator has a very low conductance state at the Fermi level and the energetically closest resonance should have a transmission probability of 1. This would indicate that an imperfect molecular insulator might be an ideal electronic device, for example, a molecule with saturated alkane groups. Such a molecule will be used below as one of reference points in the following calculations. The energetic separation of the nearest molecular resonance and the Fermi level define the subthreshold swing. To create functional devices, a transmission equal to or ~0 at the Fermi level is combined with an energetically nearby molecular resonance. In FIG. 13(b), it is shown how a gate voltage may shift the transmission zero away from the Fermi energy. For a functional transistor this behavior would be ideal because at very low source-drain voltage an applied gate could switch the molecule from an on state to an off state. FIGS. 13(c) and (d) represent two possible scenarios for what can occur in a chemical sensor device, respectively. In FIG. 13(c), a chemical reaction, photoisomerization or possibly a change in the number of electrons on the molecule, causes a very large change in the transmission function. A large change in the molecule of interest would make reproducible switching more difficult to control in a device. While not ideal for fast repetitive switching, this method of charging a device may provide a route to creating a functional memory device with distinct on/off states representing bit storage. FIG. 13(d) represents a shift of the molecular orbital energies upon chemical or physical binding of a molecular group, switching the molecule from an off conductance state to an on conductance state. It is also conceivable that smaller shifts in the transmission spectrum would allow sequential detection of multiple molecules. Calculations showing both the effects of gating (b) as well as the tuning of a transmission feature (d) will be shown in the following sections.

Example 4

In this exemplary embodiment of the present invention, a molecular quantum interference device provides a new avenue to be used as molecular electronic elements. The sparse density of electronic states in organic molecules stands in sharp contrast to traditional metals or semiconductors, and is promising for controllable interference. It has recently shown that cross-conjugated molecules can have a large dip in the electron transmission probability due to interference between electron transport pathways in energetic space.[45,46] Cross-conjugation dictates the directionality of the coupling across a double bond. "A cross-conjugated compound may be defined as a compound possessing three unsaturated groups, two which although conjugated to a third unsaturated center are not conjugated to each other."[34] It is shown, using model systems, that any site energy not directly between the source and drain will cause interference features in the transmission.[47] Most of these interference features occur at energies outside the highest occupied molecular orbital (HOMO)—lowest unoccupied molecular orbital (LUMO) gap. What makes cross-conjugated molecules intriguing from a molecular electronics point of view is the location of the interference feature at or near the Fermi energy in an experimentally relevant location.[45,47] There is a large synthetic knowledge base regarding cross-conjugated molecules[48] indicating that this molecular motif may provide a unique new area for designing electronic devices. In previous work of the inventors, it was calculated the dynamic range in transmission probability accessible near the Fermi level to be ~9 orders of magnitude.[45] This large variation in transmission probability is attributed to interference cancelling transport through the π system.[45] This interference behavior opens the possibility of having a molecule that acts like an insulator (alkane) at low bias and a π conjugated molecule at slightly higher bias. The HOMO and LUMO energy levels are unrelated to the presence of an interference feature, thus it is conceivable to design a conjugated molecule with a small HOMO-LUMO gap and extremely low mid-gap conductance. This behavior matches well with the specifications that are showed earlier in FIG. 12 and FIG. 13.

Example 5

In this exemplary embodiment of the present invention, methods for calculating transport through single molecules in the Laundeur-Imry low bias tunneling regime are described.[49,52] In the low bias tunneling limit, one can assume that the electron does not spend a significant amount of time on the molecule in the junction, leaving the molecule in the neutral state. In the molecules that are analyzed here, the interference generally occurs within the HOMO-LUMO gap, energetically separated from molecular resonances. All molecular structures are geometry optimized in the absence of gold electrodes using density functional theory, using B3LYP[53,54] and 6-311G** in QCHEM 3.0.[55] The gas phase molecules were chemisorbed (terminal hydrogens removed) to the fcc hollow site of a Au(111) surface with the Au—S bond length taken from the literature.[56] All transport calculations are initially done using Hückel-IV 3.0[43,44,57] due to the speed of the calculation. The results from Hückel-IV 3.0 have shown to be quite consistent[45] with those done using the more computationally intensive density functional transport codes such as gDFTB[58-63] and ATK.[42,64-67] gDFTB has been used to analyze the symmetry components of the transport and ATK has been used to simulate an applied gate voltage. In both cases the Hückel-IV calculation is shown for comparison. In situations where interesting transport behavior is calculated, it is verified using density functional calculations as indicated in the text. In this disclosure, all of the calculations are completed on the geometry optimized structure; however, using molecular dynamics coupled to transport calculations,[68] the interference features have been shown to be stable to geometric fluctuations and the breaking of symmetry.[45,47] The use of three transport codes allows for verification of results over a range of methods. Common among the three methods are the use of one electron Hamiltonians and non-equilibrium Green's function methods for the transport. Both Hückel-IV and ATK calculate the full 3D self-consistent potential under voltage bias. Hückel-IV 3.0 uses extended Hückel molecular orbitals and a relatively small Au electrode pad of 3 atoms on each end of the molecule. It is also the fastest computationally. gDFTB is a tight-binding DFT program. Due to the computational benefits of self-consistent parameterization, this code allows for analysis of very large systems, including large physical electrodes. The gDFTB program has symmetry implemented, allowing a detailed analysis of the results. ATK is currently the state of the art DFT commercial transport package. ATK is run using a DZP (SZP for Au) basis set using the LDA functional. The gate voltage is calculated within the ATK code by shifting the part of the Hamiltonian that remains when the electrode and surface atoms are removed, which assumes an external electrostatic potential localized to the molecular region and not a physical electrode.[67] In this calculation the gate is not included as a physical electrode, solely a shift in the energy levels. The actual gating effect may deviate substantially from this idealized model. Experimental methods of gating a molecule could utilize previous techniques or a third electrode in UHV[12,15-19] or with electrochemical control.[20-24]

Example 6

Figure 14:
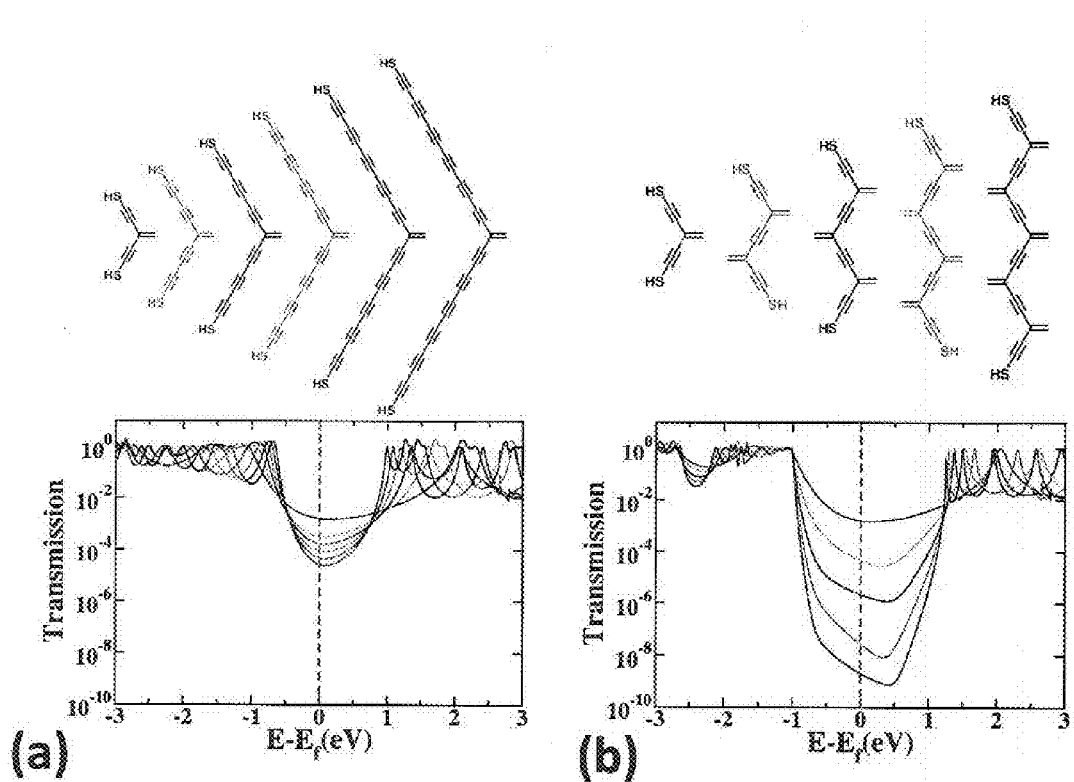
FIGS. 14 (a) and (b) show the behavior of the HOMO and LUMO energies and the interference minimum with increasing molecular length, respectively. In the series of molecules shown in (a), one triple bond is added to both ends of the molecule. This increased conjugation length leads to a smaller HOMO-LUMO gap and a small decrease in the transmission minimum. In (b), a cross-conjugated unit and a triple bond are added leading to little change in the HOMO-LUMO gap but a large decrease in the transmission minimum.

In this exemplary embodiment of the present invention, and in connection with FIG. 14, it is shown two series of molecules with increasing carbon backbone length. In FIG. 14(a), a pair of triple bonds is added symmetrically to a cross-conjugated molecule. Shown in FIG. 14(b) is a series of molecules where the cross-conjugated backbone has been synthesized,[48-69] made with an increasing number of cross-conjugated units separated by triple bonds. Comparing the position of the HOMO and LUMO for the molecules shown in FIG. 14(a) and FIG. 14(b), there is a noticeable difference in the energy shift of the resonances near −1 eV and 1 eV. In FIG. 14(a), the addition of two triple bonds to the molecule increases the length of electron delocalization and decreases the HOMO-LUMO gap spacing. In FIG. 14(b), with the addition of a cross-conjugated bond and a triple bond the HOMO level remains unchanged and the LUMO orbital shifts slightly, lowering the energetic gap. This behavior is indicative of the cross-conjugated unit breaking electron delocalization.[70-73] As the transmission near π electron dominated interference features in cross-conjugated molecules is determined by the σ transport, we need only lower the σ coupling across the molecule to lower the transmittance minimum. In FIG. 14(a), the increased electrode separation caused by the additional triple bonds results in a relatively small reduction in the interference minimum. In FIG. 14(b), the transmission minimum decreases ~1.5 orders of magnitude for each 3 carbon atom repeat unit added. This is a much greater sensitivity to length than in (a) where each pair of triple bonds decreases the transmission ~0.3 orders of magnitude for each repeat unit.

Example 7

Figure 15:
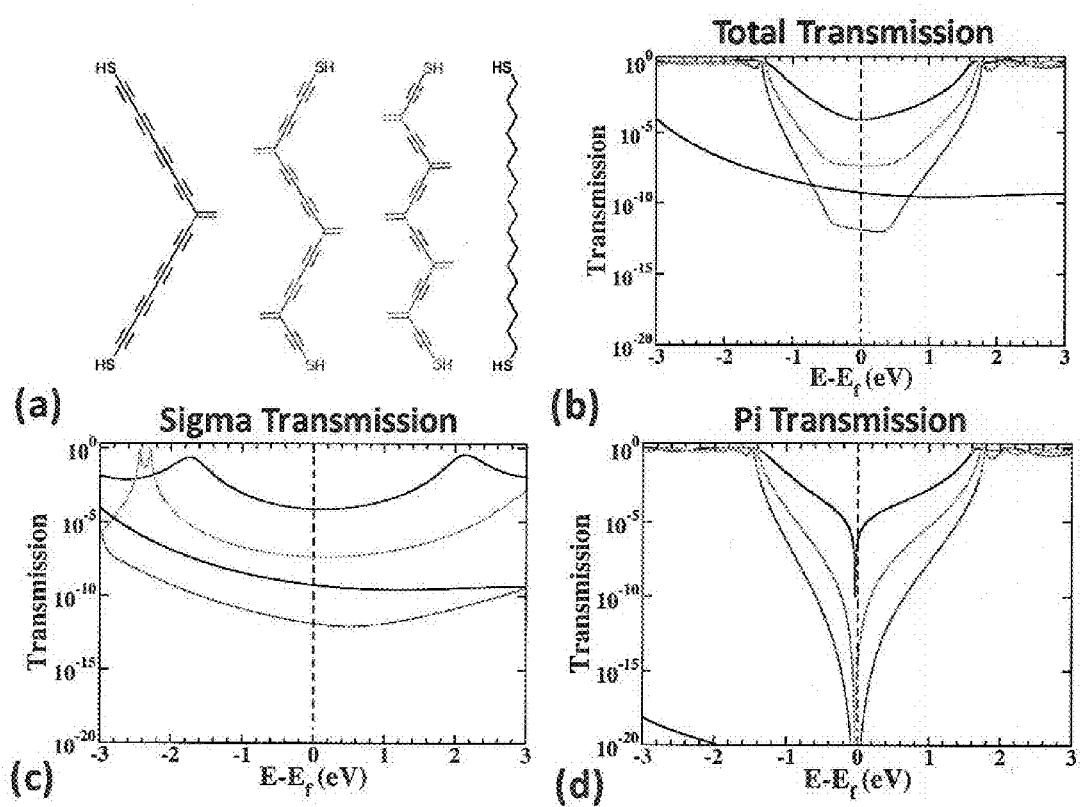
FIG. 15 shows calculations done using sgDFTB to differentiate between the σ and π transport. In (a), four molecules with a 17 carbon atom backbone are shown: three conjugated molecules with 1,3, and 5 cross-conjugated units, and one saturated carbon chain. In (b), the total transmission through the 4 molecules is shown with ~8 orders of magnitude variation in transmission at $E_f$. In (c), the σ transmission at $E_f$ decreases ~2 orders of magnitude for each added cross-conjugated bond. The kinks in the carbon backbone in the cross-conjugated molecule decrease the σ coupling. The π component of the transmission is shown in (d): both the depth and width of the interference feature increase sharply with added cross-conjugated units.

In this exemplary embodiment of the present invention, in order to address the different behavior of these two classes of molecules discussed in EXAMPLE 6, the transmission for a series of molecules with 17 carbon atoms in the backbone, shown in FIG. 15(a), was calculated. All plots in FIG. 15 are calculated in the gDFTB code so that a symmetry analysis[74] could be completed. From the plot shown in FIG. 15(a), it hints that increasing the number of cross-conjugated units increases both the width and depth of the interference feature. To separate the contributions from decreasing σ coupling across the molecule and the increasing number of cross-conjugated units, it is included a plot of the σ transport through all 4 molecules in FIG. 15(c). This plot indicates that it is the σ transport and not the number of cross-conjugated units that defines transmission near the minimum. Thus, at low bias it is possible to directly measure the σ transport in conjugated molecules. Cross-conjugated molecules may thus provide a template for studying σ transport through bridged molecules, including alkene, alkyne, and aryl systems.

Example 8

In this exemplary embodiment of the present invention, in order to investigate the sensitivity to changes in electron density, it is investigated the effects of attaching electron withdrawing and electron donating groups. These calculations are all competed using Hückel-IV (the corresponding calculations using ATK are shown in supporting information). Using a known molecular scaffold[75] with a single cross-conjugated unit, it was calculated the change in transmission upon binding a series of electron donating and electron withdrawing groups to the cross-conjugated unit. FIG. 8(a) shows the effect of increasing the electron withdrawing strength of groups bonded to the cross-conjugated unit. The electron withdrawing groups have two major effects on the transmission near the Fermi level. The first effect is the movement of the LUMO resonance from ~11.5 eV for the hydrogen terminated cross-conjugated molecules to ~0.4 eV for the $NO_2$ substituted molecule. This correlates with a similar shift in the interference feature to lower energy. In the CHO and $NO_2$ substituted molecules, the interference feature is seen at an energy below the HOMO molecular level. The low bias conductance for these molecules changes by ~$10^3$ with increasing electron withdrawing strength. In FIG. 8(b), the electron donating groups provide similar behavior to the electron withdrawing groups, but in the opposite energy direction. In most cases both the HOMO and LUMO shift to higher energy. The one exception to this is the phenyl substituted group shown in blue, where the increased electron delocalization provided by the aryl ring narrows the HOMO-LUMO gap. In all of the molecules with electron donating substituents, the interference features shift to higher energy and towards the LUMO molecular orbital. These calculations suggest that the interference feature is broadly tunable across the HOMO-LUMO gap region. In designing molecular devices, this broad tunability should allow alignment of the Fermi level with the interference minimum, providing an effective off state at zero voltage bias.

Example 9

Figure 16:
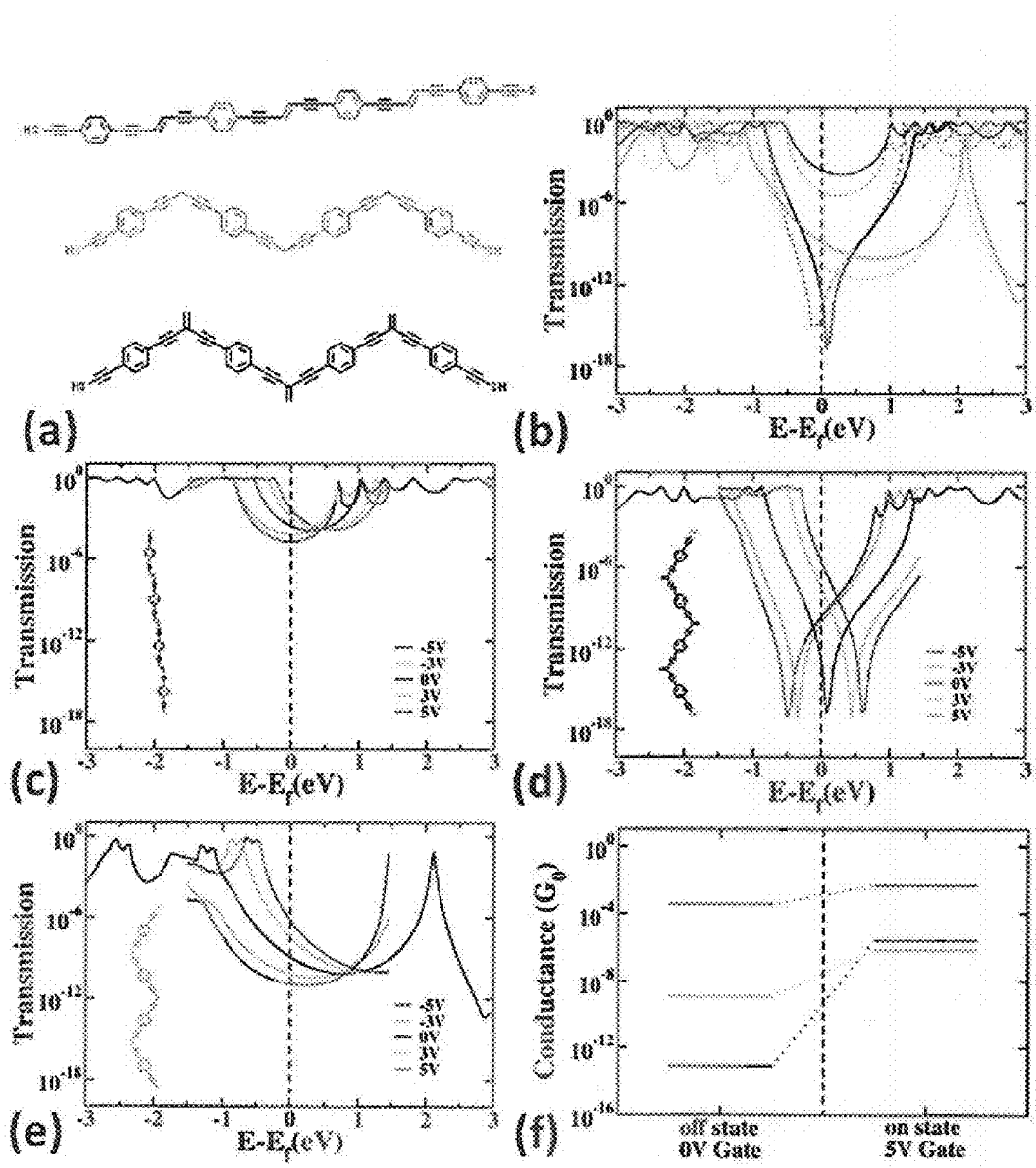
FIG. 16 shows calculations of conductance change with applied gate voltage in three test molecules. In (b), the transmission spectrum calculated for the molecules shown in (a) includes a promising potential molecular transistor, the cross-conjugated molecule in black. The solid lines are calculated using ATK and the dashed lines calculated using Hückel-IV. (c) (d) and (e) show the effect of gate voltage on the conductance plot. (f) shows the calculated change in conductance between on and off state of ~8 orders of magnitude in the cross-conjugated molecule.

In this exemplary embodiment of the present invention, a potential molecular transistor having a cross-conjugated oligo(phenylene-enynylene) molecule with 3 repeat units is shown.[75] In FIG. 16, a comparison of the cross-conjugated molecule to a molecule where the conjugation is broken and to the full conjugated oligo (phenylene-ethynylene) is illustrated. In FIG. 16(b), the transmission curves for these three molecules are calculated using two different transport codes: ATK shown with solid lines and Hückel-IV shown as a dotted line. For transmission factors that span ~16 orders of magnitude, the two transport codes agree very well. The differences between the two codes lie in the exact position of the resonances and the minima between them. Experimental results are required to calibrate the performance of these methods; however, the trends are consistent. One can see from FIG. 16(b) that the cross-conjugated molecule shown in black has a change in transmission probability of ~16 orders of magnitude over 0.88 eV range in incident electron energy. In comparison, for the molecule shown in green, with $CH_2$ groups breaking the conjugation, the electron transmission changes 8 orders of magnitude over 1.2 eV. In FIG. 16(c), the transmission probability is shown for a fully conjugated species with a 5V applied gate voltage, calculated in ATK. To compare the gate voltage effect, conductance for a cross-conjugated molecule is plotted in FIG. 16(d). As the bias voltage→0 the conductance is proportional to the transmission at the Fermi level. In FIG. 16(f), it has been defined the off state as no perturbation to the system, and the on state as 5V gate voltage. The conductance through the cross-conjugated molecule changes by 8 orders of magnitude with an applied gate voltage of 5V. Where the cross-conjugated units are replaced by saturated carbons, the conductance changes 3 orders of magnitude, and the fully conjugated molecule, shown in red, changes 1.5 orders of magnitude. These results could be optimized by engineering the interference minimum to occur directly at the Fermi level. The on state could possibly be increased 5 orders of magnitude in the case of the cross-conjugated molecule by increasing gate voltage shifting the HOMO-orbital closer to the Fermi level; however, approaching resonance increases the probability of electron charging and molecular rearrangement. The cross-conjugated molecule has a subthreshold swing of ~625 mV/decade (calculated by using the transmission difference between 0V and 5V gate voltage), which is ~2.5 and ~5.25 times lower than in the conjugated and saturated molecules. The comparison between these rates is important because the conversion between the gate voltage used in the calculations and the gate electrode in the experiment is non trivial[67] and will have a large effect on the absolute value of the subthreshold swing. The large dynamic range, sensitivity to incident electron energy, and switching based on changes in electron density make cross-conjugated molecules promising candidates for molecular transistors.

Example 10

Figure 6:
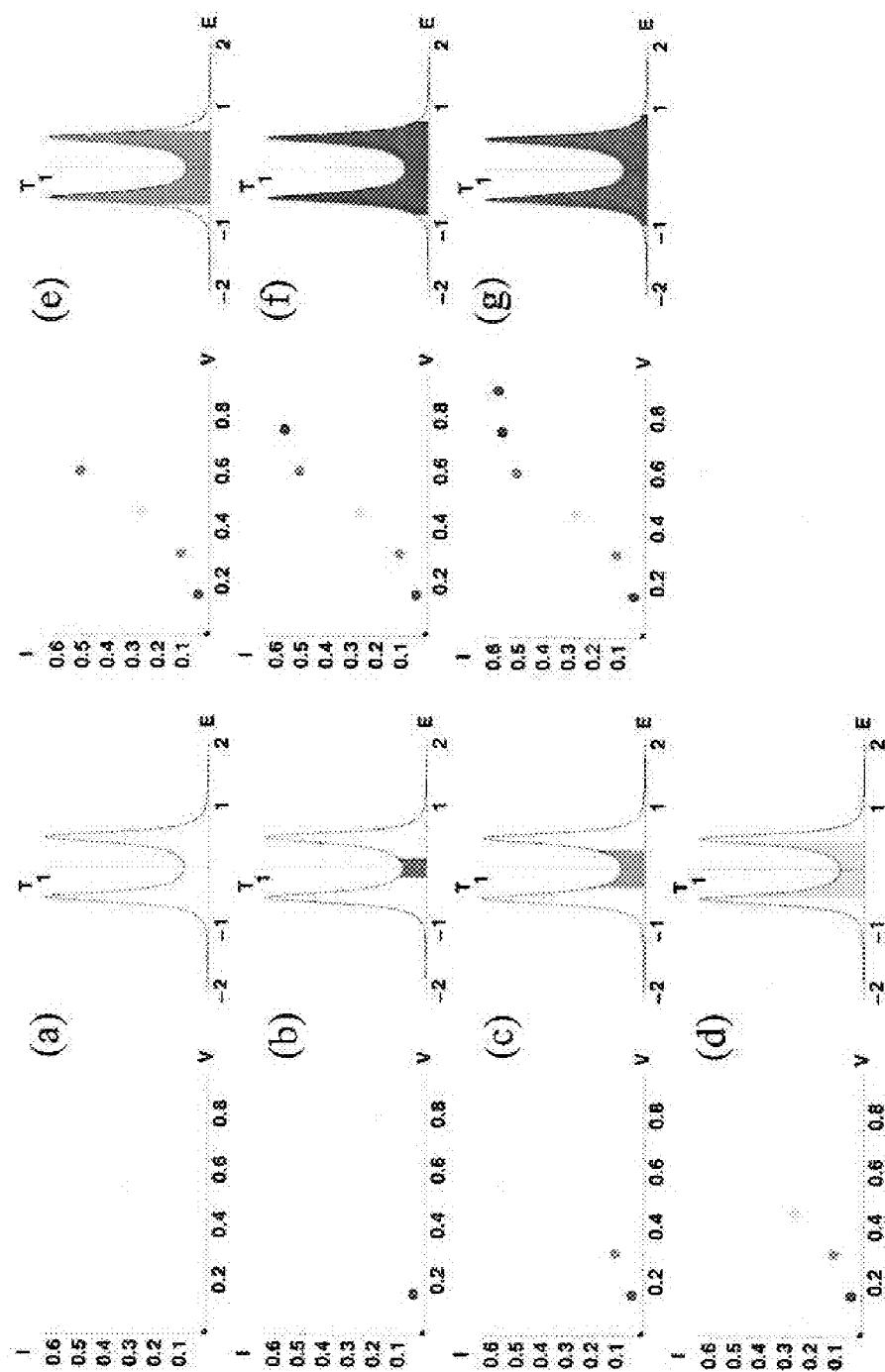
FIG. 6 shows the correspondence between a current-voltage curve and a transmission curve according to various embodiments of the present invention.

In this exemplary embodiment of the present invention, in connection with FIG. 6, how a transmission spectrum translates to a measured current is described. The plot on the left panel in FIG. 6 shows the measured current as a function of voltage and the plot on the right panel in FIG. 6 shows the region of the transmission spectrum that is included in the integral. A large dip in a transmission spectrum will translate to low current and conductance, whereas a peak in the transmission spectrum will lead to higher conductance and current. The assumption in the scheme shown in FIG. 6 is that the form of the transmission curve does not change as a function of the applied bias voltage. This assumption does not hold in the bias dependent non-switching devices we will show here. It is the variation of the transmission spectrum that results in the function of these devices. In the case of bias independent non-switching devices, the form of the transmission curve may change with applied bias, or not, but in any case the insulating character of the material is desirable over the range of operation. The energy range of the integration is controlled by the applied bias; however, the form of the transmission curve is controlled by the (possibly) voltage-dependent properties of the molecule. For a bias dependent non-switching device according to an exemplary embodiment of the present invention, the position of the interference feature may move as a function of the applied bias voltage. If this movement results in the interference feature (large dip in the transmission) moving in or out of the window of integration then there may be dramatic changes in the current with increasing voltage.

Example 11

In the above description of cross-conjugation and interference effects in transmission, it mainly dealt with the case of a single (sometimes degenerate) interference peak in symmetric molecules. In asymmetric molecules, one can calculate a splitting of the interference peaks and more complex transmission features. By engineering the interference locations and using asymmetric molecules, more complex devices can be designed. In this exemplary embodiment of the present invention, a single molecule rectifier is described. This proposal was based on having a donor and acceptor group in a single molecule with a saturated molecular spacer separating the groups. The saturated linkage between the functional parts of the molecule reduces communication between these distinctly separate groups.[6] In the intervening years, many experimental attempts have been made[78] to measure a rectification ratio in single molecule transport, with marginal success in comparison with solid state devices. It has been noted that having asymmetric coupling to the electrode also leads to an increased rectification ratio.[79-83] The rectification ratio as a function of voltage is defined as the current in one bias direction divided by the current in the other bias direction. Measurements of rectification in thin films have been completed for over 40 years.[84,85] Recent experimental measurements on thin films of molecules have measured rectification ratios of up to 3000.[86] While molecules in a thin film can behave differently than at the single molecule level, experimental advances have been made towards understanding systems at both limits.[86] A number of published experimental and theoretical investigations show molecular rectifiers with rectification ratio typically <<100. Very recent work using the barrier tunneling model for transport suggests that the rectification ratio for single molecules will never be greater than 100.[88] All of these results are a far cry from typical solid state rectification ratios that can be >$10^5$. In this section it is focused on the electronic responses that can occur when multiple non-degenerate interference features are found in a single molecule. Essentially, most of the desired electrical elements can be redesigned in molecules with interference features to take advantage of the increased dynamic range. To illustrate these effects, it is shown model calculations on candidate molecules. It should be cautioned that in molecules that are very sensitive to Fermi level placement (band lineup), the accuracy of the calculation is limited. While the molecules presented here show extremely interesting behavior, small changes in the relative position of the Fermi level and the molecular resonances could have large consequences in the measured response. The extreme sensitivity to these features will surely test the computational codes but will also provide a direct way to improve their accuracy by comparison with future experimental measurements. Much of the uncertainty lies in the location of the Fermi level. It would be ideal if the Fermi level could be varied and tuned to test the behavior of the molecule (perhaps using an alloyed or coated tip).

Figure 7:
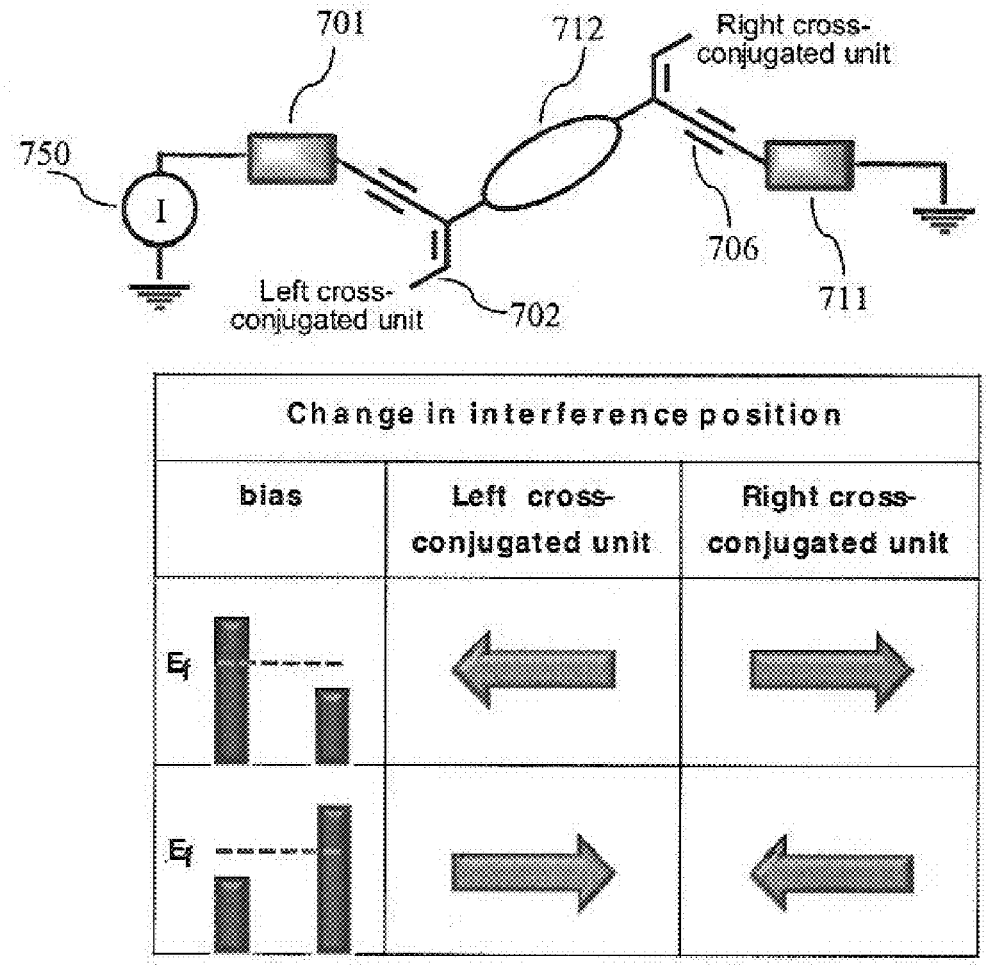
FIG. 7 shows schematically an apparatus of rectifier operation for the example of two cross-conjugated units separated by a spacer according to one embodiment of the present invention. The interference positions move in two different directions with applied bias as a result of their different positions relative to each of the two leads. Note that in molecules with multiple cross-conjugated units, an applied bias voltage will split the interference features. This splitting occurs because an applied bias has an electron donating or withdrawing effect that moves the interference position as shown in FIG. 8 below. Further note that the more positive an electrode is, the more it moves the interference feature of the closest cross-conjugated group to lower energy and conversely the more negative an electrode, the more it moves the interference feature to higher energy.
Figure 8:
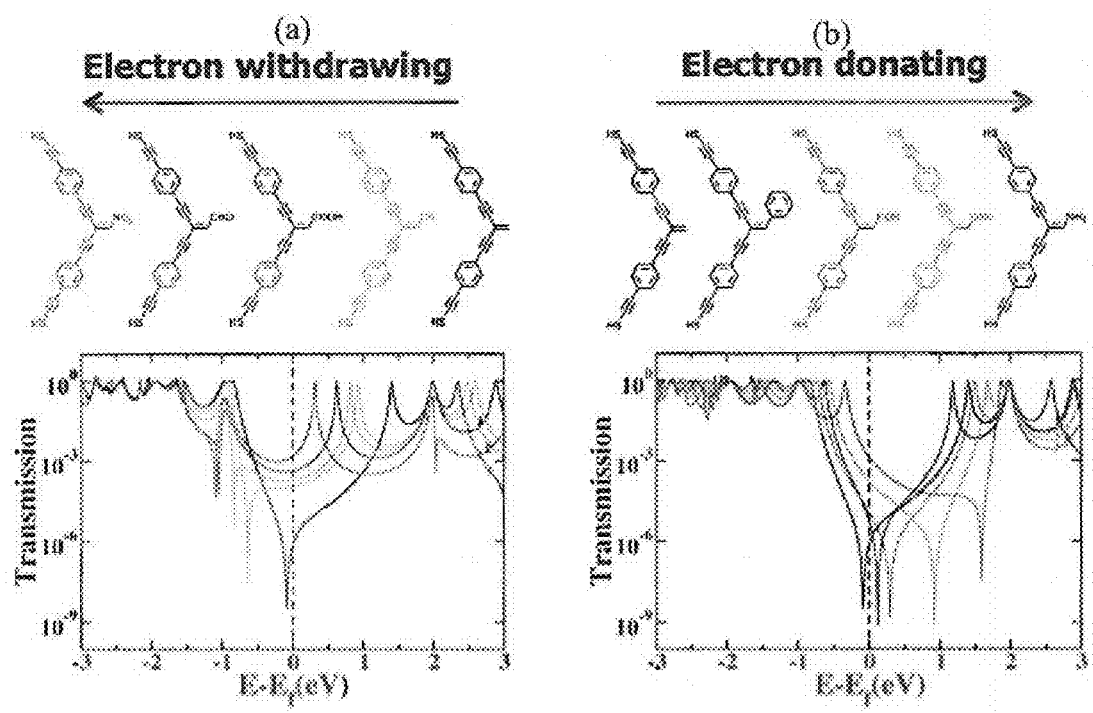
FIG. 8 shows the shifting of the interference position in a molecule with substituents off a cross-conjugated unit as the QIU according to one embodiment of the present invention. Note that electron donating and withdrawing groups are attached to the cross-conjugated unit. The interference feature is shown to be tuned ±1.5 eV from the Fermi level by changing the electron density on the cross-conjugated bond. The qualitatively similar results calculated using ATK are given in the supporting information.
Figure 9:
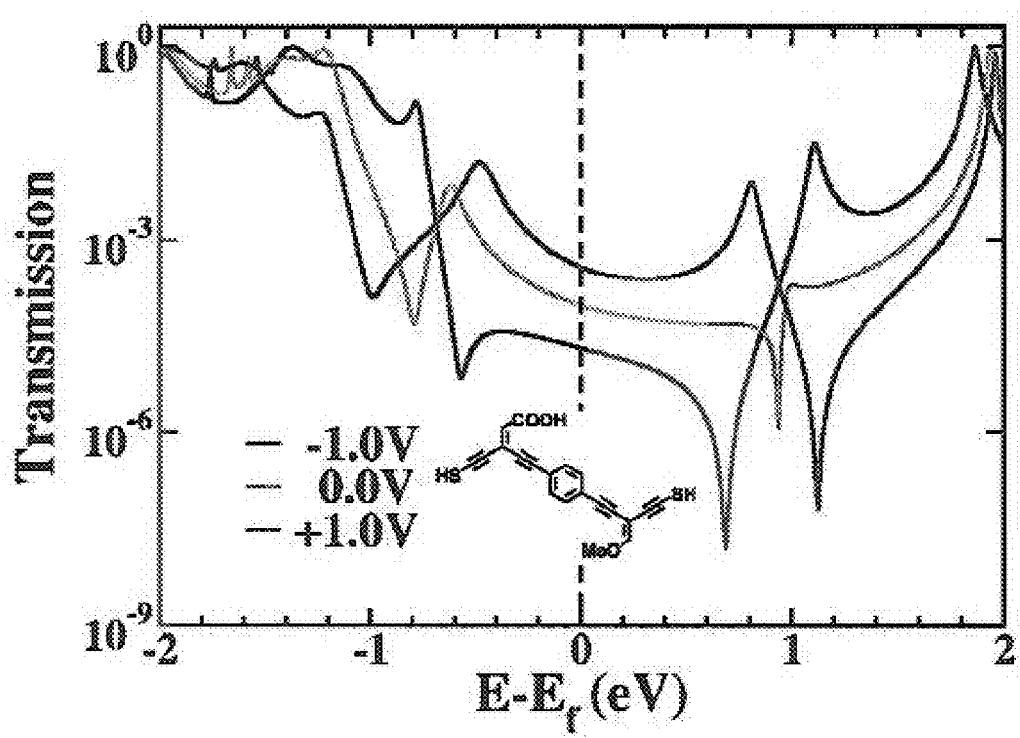
FIG. 9 shows that, for a small example rectifier with two cross-conjugated units separated by a spacer according to one embodiment of the present invention, the transmission curves move substantially with applied bias (shown in darker and lighter lines for $V_{SD}$=+1V and −1V, respectively). Note that an asymmetric molecule with the corresponding transmission plots is shown as an insert. The asymmetry causes two antiresonance features at different energy. At negative bias these antiresonance feature move together and at positive applied bias they move apart.
Figure 17:
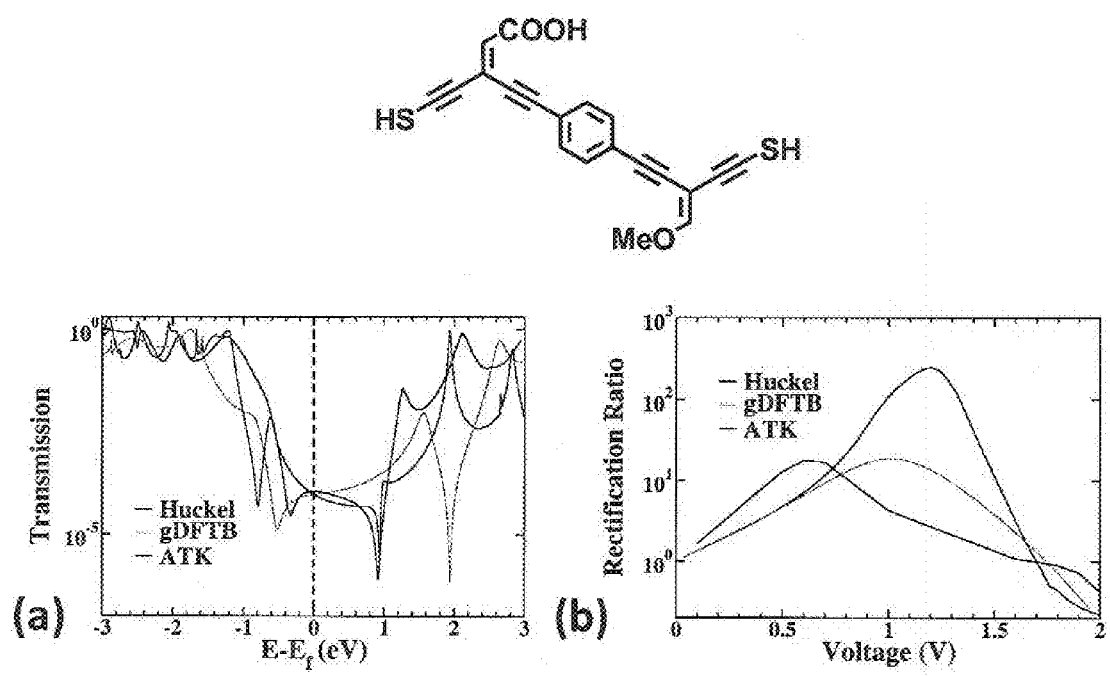
FIG. 17 shows transmission spectrum calculated using gDFTB, ATK and Hückel-IV in (a), and the rectification ratio as a function of voltage calculated using these programs in (b), respectively. Differences in the location of the resonance and interference features between the codes lead to a change in the voltage and magnitude of the maximum rectification ratio. More importantly, the behavior of the antiresonances is consistent between codes.

In FIG. 8, electron donating and withdrawing groups were shown to move the interference peak over ±1.5 eV from the Fermi energy. Using the effects of the electron donating and withdrawing groups on the position of the molecular resonance, a class of single molecule rectifiers is shown in FIG. 7. such a single molecule rectifier has two cross-conjugated units 702, 706 (or other groups that produce interference features, e.g., meta substituted benzene) with split interference features, separated by a conjugated spacer 712. With an applied bias, provided by voltage source 750, across the molecule through electrodes 701 and 711, the interference positions are expected to move towards each other or away from each other as shown in the lower panel of FIG. 7. This is a result of the interference response in cross-conjugated molecules to electron donation and withdrawal. This response is calculated with Hückel-IV as shown in FIG. 9. This molecule has a cross-conjugated unit with a methyl ether and a cross-conjugated unit carboxyl termination. In this context, the carboxyl terminated cross-conjugated unit is the more "electron withdrawing" group and the ether terminated unit is the more "electron donating" group. In FIG. 9, the transmission through this molecule is shown at three different voltage points −1, 0, +1, respectively. The interference dips come towards each other at negative bias and split farther apart at positive bias. In Hückel-IV it was calculated a rectification ratio of 249 at 1.2V as shown in FIG. 17(b). Also shown in FIG. 17 is the variation calculated in the rectification ratio among three transport programs. The maximum rectification ratios are calculated to be 18.6 at 1.0V in gDFTB and 17.6 at 0.6V in ATK. The behavior of the molecules under applied bias is nearly consistent between the codes with the interference features moving ~0.25 eV per 1V bias.

Back to FIG. 7, it can be summed that when the bias voltage is applied in one direction the interference features in the transmission from the two QIU's in one energy direction and when the opposite bias is applied the interference features will move in the opposite energy direction. Depending on the position of the interference features at zero bias, this can result in the interference features moving into, or out of, the bias window of the integration with changes in the applied bias voltage. The initial energy position of the interference features is controlled by the nature of the QIU and in particular any electron donating or withdrawing groups on the QIU. As shown in FIG. 8, the initial ($V_{SD}=0$) position of the interference features can be tuned around the Fermi energy by the use of substitutents off the cross-conjugated unit. Thus, a careful choice of combinations of substitutents (usually one from the electron donating side and one from the electron withdrawing side for a rectifier) can lead to desired performance characteristics. FIG. 9 shows how the transmission curves can vary with applied bias voltage for a small example of a rectifier with two cross-conjugated units as the two QIUs. The two interference features shift towards the Fermi energy with negative bias and away from the Fermi energy with positive bias. This leads to substantial asymmetry in the current-voltage curve as these interference features move into or out of the bias window.

In all of the above transport calculations, increasing the conjugated spacer length in the center of the molecule leads to a corresponding increase in the rectification ratio. One other limiting factor is the relatively small change in transmission probability between the dip in the interference features and the highest transmission point between the interference dips. This region between the split interference features has a large effect on the maximum rectification ratio. The magnitude of the transmission between the split interference features can be increased dramatically by having a molecular resonance near the Fermi level with interference features separated equally energetically above and below this resonance. Oxygen containing molecules can have molecular resonances near the Fermi level. A molecule that has been experimentally measured[89] and calculated[3] contains the anthraquinone functional group, a cyclic cross-conjugated group. This group has the characteristics of interest, an interference feature below the Fermi energy and a localized resonance just above the Fermi energy.[89]

Figure 10:
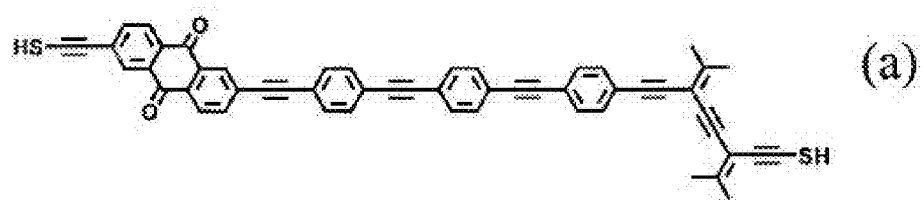
FIG. 10 shows the performance of an example rectifier with a cyclic cross-conjugated QIU at one end and two linearly cross-conjugated units at the other according to one embodiment of the present invention. In the middle panel the red curve is current in the forward bias direction and the black curve is the negative of the current in the reverse bias direction so that the two can be seen together. This large asymmetry in the current-voltage characteristics results in a large rectification ratio. Note that in (a), the positive bias current/voltage behavior is shown as curve 1001 and the negative bias current/voltage behavior is shown as curve 1003. The rectification ratio is calculated by dividing the positive voltage bias by the negative voltage bias. In (b), the rectification ratio as a function of voltage, as curve 1101, shows a peak of >150,000 at 0.8V applied voltage.
Figure 10:
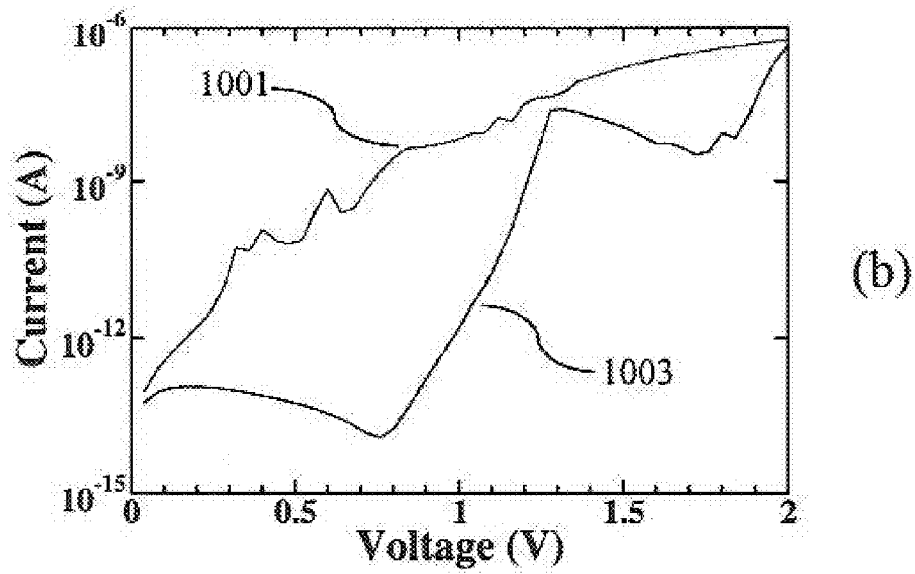
Figure 10:
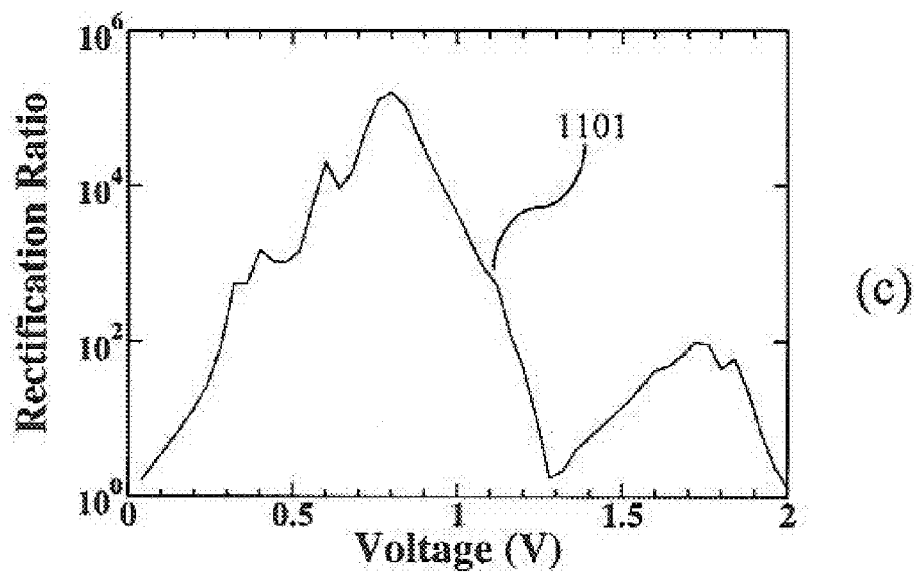

To create a molecule with a resonance split by two anti-resonance peaks, a cross-conjugated unit was asymmetrically added. As shown in FIG. 10, the anthraquinone functional group has been taken with an added large conjugated spacer and two methyl-terminated cross-conjugated groups (the second cross-conjugated unit orients the sulfur termination towards the Au electrodes). In FIG. 10, it is shown the current voltage behavior and the rectification ratio for the molecular rectifier. As the interference features come together with negative bias, the current decreases from 0.2-0.8 Volts, while in the positive bias, the current increases as the interference dips move apart. The rectification ratio increases steadily from 0-0.8V where it quickly falls off. At 0.8V the rectification ratio of >150,000 is orders of magnitude higher than other published single molecule rectifier calculations or experiments, without relying on asymmetric binding to the electrodes. This result indicates that molecular devices may function as coherent (fast) electronic devices.

The choice of molecule was dictated by the location of the resonances and the interference features within one transport code. Any candidate molecular rectifier would show slightly different behavior using the three transport programs that have been chosen. While the rectification behavior has been calculated for one code, it is believed that this behavior can be seen, in experimental measurements with different functional groups chosen to control the position of the resonances and interference locations. Thus, a larger molecule can be engineered to have more dramatic rectification properties. As shown in FIG. 10, the observable quantities for such a system, the current-voltage curve and the rectification ratio as a function of applied bias are more prominent. Note that in the current-voltage curve for this system there are regions where negative differential resistance is evident (current decreases with increasing bias voltage). This occurs as an interference feature, which was previously outside the bias window, enters the range. This is one central feature of the operation of the bias dependent devices of the present invention. Interference features can be tuned to move into and out of the bias window by controlling their initial position with chemical substitutents and their movement by the applied bias voltage. Further note that non-switching devices (high and low K dielectrics) simply require interference features to remain in the bias window. The same principles for controlling the initial position of the interference features are used as for the bias dependent devices but now devices need to be designed to ensure that interference features remain actively suppressing current at operational bias voltages.

Figure 18:
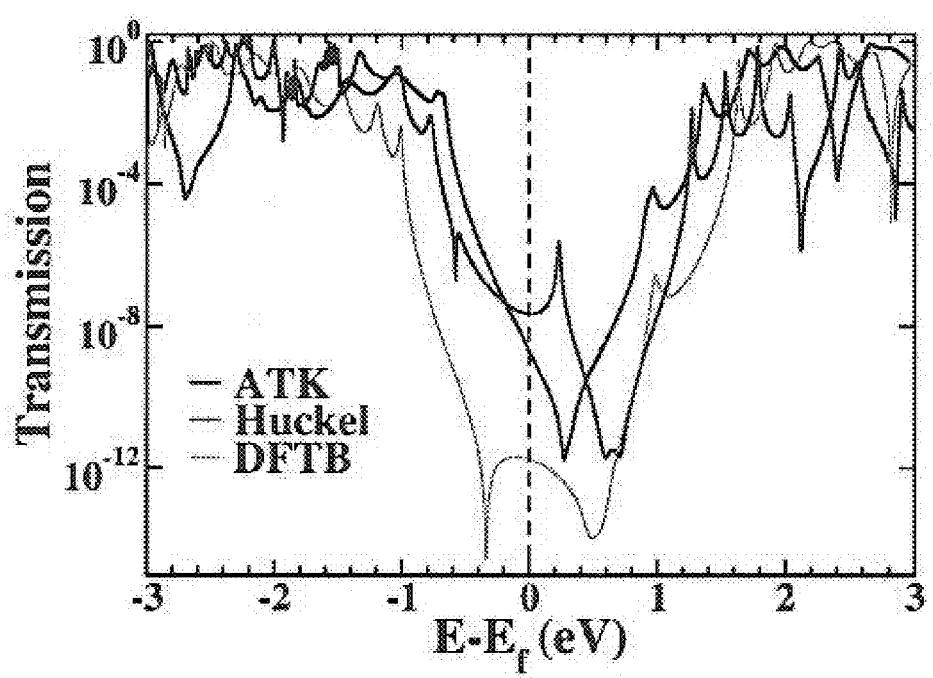
FIG. 18 shows transmission plots for the molecule shown in FIG. 10 calculated using gDFTB, Hückel-IV 3.0 and ATK. The differences in the transmission spectrum are largely due to the energetic positioning of the antiresonance features and the localized oxygen resonance. The changes in the transmission spectrum lead to large changes in the maximum rectification ratios calculated from >150,000 in Hückel-IV, to 501 in gDFTB, to 83.5 in ATK.

In FIG. 18, the zero voltage transmission is shown using the three different transport codes. These changes in the transmission features, specifically the lack of split antiresonance features in ATK, have a noticeable effect on the calculated maximum rectification ratio. In gDFTB, the maximum rectification ratio is 501 at 0.52V and in ATK the maximum rectification is 83.5 at 1.5V. While these rectification ratios are very high for calculations on single molecule rectifiers, they are much lower than the value calculated in Hückel-IV. This is not surprising and is a direct consequence of the variations between transport codes. All three of these results will likely vary from experimental measurements because of the sensitivity to interference and resonance peaks. This sensitivity is a direct result of having a large dynamic range in transmission probability where small changes in the energy have large effects on the transport behavior.

Example 12

In this exemplary embodiment of the present invention, it is described that one other feature observed in the current-voltage behavior of some of these cross-conjugated molecules is a rapid decrease in current with increasing voltage, or negative differential resistance (NDR). An NDR-like behavior is most strikingly seen in the plot shown in FIG. 10 where the current in the negative voltage direction decreases 1 order of magnitude between 0.2 and 0.7 volts. This is a result of interference features moving together with increasing voltage. In reported NDR in molecules on silicon surfaces, the conductance dip is attributed to the conduction band edge passing a molecular resonance.[13,90] Interference features in a transmission spectrum are equivalent to resonant peaks but with an opposite sign in transmission plots. If the transport is dominated by the band edge this indicates that interference dips should provide NDR behavior similar to that reported in the literature for the case of sweeping through molecular resonances. The advantage of observing NDR features caused by interferences (or by resonance without charging) is that these can occur without geometry change in the low bias tunneling regime. This could lead to a much faster response, enhanced stability, and longevity of potential devices.

Example 13

According to various exemplary embodiments of the present invention set forth above, cross-conjugated molecules and their extreme sensitivity to incident electron energy open up new possibilities in single molecule electronics. Most switching and nonlinear behavior in molecules has relied on tuning the incident electron energy past a molecular resonance or conformation change. This can lead to charging of the molecule and possible device instability.[29,91] With cross-conjugated molecules, it was calculated a large dynamic range in electron transmission probability to occur in a chemically tunable coherent tunneling range between the frontier molecular orbitals. This allows complex electronic behavior such as switching, NDR, and rectification to occur in the low bias electron tunneling regime without charging the molecule. The depth of the interference feature is tunable by minimizing the σ transport. The location of the interference feature is shown to be tunable across the HOMO-LUMO gap. This tunability should allow for manipulation of the interference feature by chemical means so that it occurs near the Fermi level. To minimize the off-state current, having the interference minimum at the Fermi level is important, and also results in the maximum dynamic range. To study molecules with such sensitivity to the band lineup,[37,44] it would be ideal if the Fermi level could be experimentally tuned, as this might prove easier than chemical modification. These molecules and their sensitivity to the location of the Fermi level should provide a useful means of calibrating experimental results and theoretical methods. Cross-conjugated molecules could also be useful in chemical sensors where an extremely small change in electron density must be measured.[92] it was demonstrated that changing the electron donating or withdrawing ability of a side group attached to the cross-conjugated unit can produce a 3 order of magnitude change in the conductance. This sensitivity of the cross-conjugated unit to electron density also indicates that attaching a third terminal to the cross-conjugated double bond could be used to gate the molecule. Experimental realization of three terminal devices with single molecules is exceedingly difficult but these cross-conjugated molecules seem to be promising candidates for initial tests. Using a calculated electrostatic potential to gate cross-conjugated molecules, our calculations suggest that the large dynamic range in electron transmission probability could be used to tune the Fermi level along the 16 orders of magnitude change in electron transmission probability.

If the interference features could be generated in all symmetry components of the transmission, it would be conceivable to have a near-perfect insulator in close proximity to a molecular resonance, increasing the dynamic range of the system. Cross-conjugated molecules serve as an interesting case where quantum interference effects dominate the transmission spectrum near the Fermi level and the correlation of molecular conductance and energetic proximity to a frontier molecular orbital break down. These molecules serve as a reminder that the vast dimension of chemical space should yield many more interesting candidates for functional electronic devices.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES (1) Marcus, R. A.; Sutin, N. Electron Transfer in Chemistry and Biology. *Biochim. Biophys. Acta* 1985, 811, 265.
(2) Marcus, R. A. On the Theory of Oxidation-Reduction Reactions Involving Electron Transfer. I. *The Journal of Chemical Physics* 1956, 24, 966-978.
(3) Reimers, J. R.; Hall, L. E.; Crossley, M. J.; Hush, N. S. Rigid Fused Oligoporphyrins as Potential Versatile Molecular Wires. 2. B3LYP and SCF Calculated Geometric and Electronic Properties of 98 Oligoporphyrin and Related Molecules. *J. Phys. Chem. A* 1999, 103, 4385-4397.
(4) Moser, C. C.; Keske, J. M.; Warncke, K.; Farid, R. S.; Dutton, P. L. Nature of biological electron transfer. *Nature* 1992, 355, 796-802.
(5) Tombros, N.; Jozsa, C.; Popinciuc, M.; Jonkman, H. T.; van Wees, B. J. Electronic spin transport and spin precession in single graphene layers at room temperature. *Nature* 2007, 448, 571-574.
(6) Aviram, A.; Ratner, M. A. Molecular rectifiers. *Chemical Physics Letters* 1974, 29, 277-283.
(7) Joachim, C.; Gimzewski, J. K.; Aviram, A. Electronics using hybrid-molecular and mono-molecular devices. *Nature* 2000, 408, 541-548.
(8) Liljeroth, P.; Repp, J.; Meyer, G. Current-Induced Hydrogen Tautomerization and Conductance Switching of Naphthalocyanine Molecules. *Science* 2007, 317, 1203-1206.
(9) Metzger, R. M.; Chen, B.; Hopfner, U.; Lakshmikantham, M. V.; Vuillaume, D.; Kawai, T.; Wu, X.; Tachibana, H.; Hughes, T. V.; Sakurai, H.; Baldwin, J. W.; Hosch, C.; Cava, M. P.; Brehmer, L.; Ashwell, G. J. Unimolecular Electrical Rectification in Hexadecylquinolinium Tricyanoquinodimethanide. *J. Am. Chem. Soc.* 1997, 119, 10455-10466.
(10) Metzger, R. M. Unimolecular Electrical Rectifiers. *Chem. Rev.* 2003, 103, 3803-3834.
(11) Elbing, M.; Ochs, R.; Koentopp, M.; Fischer, M.; von Hanisch, C.; Weigend, F.; Evers, F.; Weber, H. B.; Mayor, M. Molecular Electronics Special Feature: A single-molecule diode. *Proceedings of the National Academy of Sciences* 2005, 102, 8815-8820.
(12) Park, J.; Pasupathy, A. N.; Goldsmith, J. I.; Chang, C.; Yaish, Y.; Petta, J. R.; Rinkoski, M.; Sethna, J. P.; Abruna, H. D.; McEuen, P. L.; Ralph, D. C. Coulomb blockade and the Kondo effect in single-atom transistors. *Nature* 2002, 417, 722-725.
(13) Guisinger, N. P.; Greene, M. E.; Basu, R.; Baluch, A. S.; Hersam, M. C. Room Temperature Negative Differential Resistance through Individual Organic Molecules on Silicon Surfaces. *Nano Lett.* 2004, 4, 55-59.
(14) Flood, A. H.; Stoddart, J. F.; Steuerman, D. W.; Heath, J. R. CHEMISTRY: Enhanced: Whence Molecular Electronics? *Science* 2004, 306, 2055-2056.
(15) Kubatkin, S.; Danilov, A.; Hjort, M.; Cornil, J.; Bredas, J.-L.; Stuhr-Hansen, N.; Hedegard, P.; Bjornholm, T. Single-electron transistor of a single organic molecule with access to several redox states. *Nature* 2003, 425, 698-701.
(16) Danilov, A. V.; Kubatkin, S. E.; Kafanov, S. G.; Bjornholm, T. Strong electronic coupling between single C60 molecules and gold electrodes prepared by quench condensation at 4 K. A single molecule three terminal device study. *Faraday Discussions* 2006, 131, 337-345.
(17) Yu, L. H.; Natelson, D. Transport in single-molecule transistors: Kondo physics and negative differential resistance. *Nanotechnology* 2004, S517.
(18) Zant, H. S. J. v. d.; Kervennic, Y.-V.; Poot, M.; O'Neill, K.; Groot, Z. d.; Thijssen, J. M.; Heersche, H. B.; Stuhr-Hansen, N.; Bjornholm, T.; Vanmaekelbergh, D.; Walree, C. A. v.; Jenneskens, L. W. Molecular three-terminal devices: fabrication and measurements. *Faraday Discussions* 2006, 131, 347-356.
(19) Liang, W.; Shores, M. P.; Bockrath, M.; Long, J. R.; Park, H. Kondo resonance in a single-molecule transistor. *Nature* 2002, 417, 725-729.
(20) Albrecht, T.; Guckian, A.; Ulstrup, J.; Vos, J. G. Transistor effects and in situ STM of redox molecules at room temperature. *Nanotechnology, IEEE Transactions on* 2005, 4, 430-434.
(21) Tao, N. Measurement and control of single molecule conductance. *Journal of Materials Chemistry* 2005, 15, 3260-3263.
(22) Li, X.; Xu, B.; Xiao, X.; Yang, X.; Zang, L.; Tao, N. Controlling charge transport in single molecules using electrochemical gate. *Faraday Discussions* 2006, 131, 111-120.
(23) Haiss, W.; vanzalinge, H.; Higgins, S. J.; Bethell, D.; Hobenreich, H.; Schiffrin, D. J.; Nichols, R. J. Redox State Dependence of Single Molecule Conductivity. *J. Am. Chem. Soc.* 2003, 125, 15294-15295.
(24) Chen, F.; He, J.; Nuckolls, C.; Roberts, T.; Klare, J. E.; Lindsay, S. A Molecular Switch Based on Potential-Induced Changes of Oxidation State. *Nano Lett.* 2005, 5, 503-506.

(25) Zhang, C.; He, Y.; Cheng, H.-P.; Xue, Y.; Ratner, M. A.; Zhang, X. G.; Krstic, P. Current-voltage characteristics through a single light-sensitive molecule. *Physical Review B (Condensed Matter and Materials Physics)* 2006, 73, 125445.

(26) Troisi, A.; Ratner, M. A. Conformational Molecular Rectifiers. *Nano Lett.* 2004, 4, 591-595.

(27) He, J.; Chen, F.; Liddell, P. A.; Andrasson, J.; Straight, S. D.; Gust, D.; Moore, T. A.; Moore, A. L.; Li, J.; Sankey, O. F.; Lindsay, S. M. Switching of a photochromic molecule on gold electrodes: single-molecule measurements. *Nanotechnology* 2005, 16, 695.

(28) Moresco, F.; Meyer, G.; Rieder, K.-H.; Tang, H.; Gourdon, A.; Joachim, C. Conformational Changes of Single Molecules Induced by Scanning Tunneling Microscopy Manipulation: A Route to Molecular Switching. *Physical Review Letters* 2001, 86, 672.

(29) Galperin, M.; Ratner, M. A.; Nitzan, A.; Troisi, A. Nuclear Coupling and Polarization in Molecular Transport Junctions: Beyond Tunneling to Function. *Science* 2008, 319, 1056-1060.

(30) Loppacher, C.; Guggisberg, M.; Pfeiffer, O.; Meyer, E.; Bammerlin, M.; Lüthi, R.; Schlittler, R.; Gimzewski, J. K.; Tang, H.; Joachim, C. Direct Determination of the Energy Required to Operate a Single Molecule Switch. *Physical Review Letters* 2003, 90, 066107.

(31) Sautet, P.; Joachim, C. Electronic interference produced by a benzene embedded in a polyacetylene chain. *Chemical Physics Letters* 1988, 153, 511-516.

(32) Joachim, C.; Ratner, M. A. Molecular Electronics Special Feature: Molecular electronics. *Proceedings of the National Academy of Sciences* 2005, 102, 8800-.

(33) Jascha, R.; Gerhard, M.; Sladjana, M. S.; Andre, G.; Christian, J. Molecules on Insulating Films Scanning-Tunneling Microscopy Imaging of Individual Molecular Orbitals. *Physical Review Letters* 2005, 94, 026803.

(34) Phelan, N. F.; Orchin, M. Cross Conjugation. *Journal of Chemical Education* 1968, 45, 633-637.

(35) Solomon, G. C.; Andrews, D. Q.; Van Duyne, R. P.; Ratner, M. A. When things are not as they seem: Quantum interference turns molecular electron transfer "rules" upside down. *J. Am. Chem. Soc.* 2008, 10.1021/ja801379b

(36) Bruus, H.; Flensberg, K. *Many-Body Quantum Theory in Condensed Matter Physics: An Introduction*; Oxford University Press, USA, 2004.

(37) Datta, S. *Quantum Transport: Atom to Transistor*; Cambridge University Press, 2005.

(38) Ohnishi, H.; Takayanagi, K. Quantized conductance through individual rows of suspended gold atoms. *Nature (London)* 1998, 395, 780-783.

(39) Itakura, K.; Yuki, K.; Kurokawa, S.; Yasuda, H.; Sakai, A. Bias dependence of the conductance of Au nanocontacts. *Physical Review B* 1999, 60, 11163.

(40) Zheng, T.; Jia, H.; Wallace, R. M.; Gnade, B. E. Characterization of conductance under finite bias for a self-assembled monolayer coated Au quantized point contact. *Applied Surface Science* 2006, 253, 1265-1268.

(41) Yasuda, H.; Sakai, A. Conductance of atomic-scale gold contacts under high-bias voltages. *Physical Review B* 1997, 56, 1069.

(42) Stokbro, K.; Taylor, J.; Brandbyge, M.; Ordejon, P. Tran-SIESTA: a spice for molecular electronics. *Annals of the New York Academy of Sciences* 2003, 1006, 212-226.

(43) Zahid, F.; Paulsson, M.; Datta, S. In *Advanced Semiconductors and Organic Nano-Techniques Part III: Physics and Technology of Molecular and Biotech Systems*; Morkoc, H., Ed.; Elsevier Academic Press: 2003; Vol. III, p 1-40.

(44) Zahid, F.; Paulsson, M.; Polizzi, E.; Ghosh, A. W.; Siddiqui, L.; Datta, S. A self-consistent transport model for molecular conduction based on extended Hückel theory with full three-dimensional electrostatics. *The Journal of Chemical Physics* 2005, 123, 064707.

(45) Solomon, G. C.; Andrews, D. Q.; Goldsmith, R. H.; Hansen, T.; Wasielewski, M. R.; Duyne, R. P. V.; Ratner, M. A. Quantum interference in acyclic systems: The unexpected conductance of cross-conjugated molecules. Submitted 2008.

(46) Solomon, G. C.; Andrews, D. Q.; Goldsmith, R. H.; Hansen, T.; Wasielewski, M. R.; Duyne, R. P. V.; Ratner, M. A. Understanding quantum interference in molecular conduction. Submitted 2008.

(47) Andrews, D. Q.; Solomon, G. C.; Goldsmith, R. H.; Hansen, T.; Wasielewski, M. R.; Van Duyne, R. P.; Ratner, M. A. Quantum interference: The orientation dependence of electron transmission through model systems and cross-conjugated molecules. Submitted 2008.

(48) Gholami, M.; Tykwinski, R. R. Oligomeric and Polymeric Systems with a Cross-conjugated π-Framework. *Chem. Rev.* 2006, 106, 4997-5027.

(49) Landauer, R. Spatial Variation of Currents and Fields Due to Localized Scatterers in Metallic Conduction. *IBM Journal of Research Development* 1957, 1.

(50) Landauer, R. Electrical resistance of disordered one-dimensional lattices. *Philosophical Magazine* 1970, 21, 863-867.

(51) The computations in this work are all based on the Landauer-Imry limit of coherent transport with only elastic scattering. This is valid in the situation where the electrode energy is not near a molecular resonance, so it holds for the low-voltage conductance cases. In higher voltage situations the currents or conductances shown (such as FIG. 7f, 9b or 10) may require a more elaborate treatment, since there is at least one molecular resonance within or near the voltage window.

(52) Galperin, M.; Ratner, M. A.; Nitzan, A. Molecular transport junctions: vibrational effects. *Journal of Physics: Condensed Matter* 2007, 103201.

(53) Lee, C.; Yang, W.; Parr, R. G. Development of the Colce-Salvetti correlation-energy formula into a functional of the electron density. *Phys. Rev. B* 1988, 37, 785.

(54) Becke, A. D. Density-functional thermochemistry. III. The role of exact exchange. *J. Chem. Phys.* 1993, 98, 5648-52.

(55) Shao, Y.; Molnar, L. F.; Jung, Y.; Kussmann, J.; Ochsenfeld, C.; Brown, S. T.; Gilbert, A. T. B.; Slipchenko, L. V.; Levchenko, S. V.; O'Neill, D. P.; Jr, R. A. D.; Lochan, R. C.; Wang, T.; Beran, G. J. O.; Besley, N. A.; Herbert, J. M.; Lin, C. Y.; Voorhis, T. V.; Chien, S. H.; Sodt, A.; Steele, R. P.; Rassolov, V. A.; Maslen, P. E.; Korambath, P. P.; Adamson, R. D.; Austin, B.; Baker, J.; Byrd, E. F. C.; Dachsel, H.; Doerksen, R. J.; Dreuw, A.; Dunietz, B. D.; Dutoi, A. D.; Furlani, T. R.; Gwaltney, S. R.; Heyden, A.; Hirata, S.; Hsu, C.-P.; Kedziora, G.; Khalliulin, R. Z.; Klunzinger, P.; Lee, A. M.; Lee, M. S.; Liang, W.; Lotan, I.; Nair, N.; Peters, B.; Proynov, E. I.; Pieniazek, P. A.; Rhee, Y. M.; Ritchie, J.; Rosta, E.; Sherrill, C. D.; Simmonett, A. C.; Subotnik, J. E.; Iii, H. L. W.; Zhang, W.; Bell, A. T.; Chakraborty, A. K. Advances in methods and algorithms in a modern quantum chemistry program package. *Physical Chemistry Chemical Physics* 2006, 8, 3172-3191.

(56) Bilic, A.; Reimers, J. R.; Hush, N. S. The structure, energetics, and nature of the chemical bonding of phenylthiol adsorbed on the Au(111) surface: Implications for density-functional calculations of molecular-electronic conduction. *The Journal of Chemical Physics* 2005, 122, 094708.

(57) Tian, W.; Datta, S.; Hong, S.; Reifenberger, R.; Henderson, J. I.; Kubiak, C. P. Conductance spectra of molecular wires. *The Journal of Chemical Physics* 1998, 109, 2874-2882.

(58) Pecchia, A.; Carlo, A. D. Atomistic theory of transport in organic and inorganic nanostructures. *Reports on Progress in Physics* 2004, 67, 1497-1561.

(59) Elstner, M.; Porezag, D.; Jugnickel, G.; Elsner, J.; Haugk, M.; Frauenheim, T.; Suhai, S.; Seifert, G. Self-consistent-charge density-functional tight-binding method for simulations of complex materials properties. *Phys. Rev. B* 1998, 58, 7260-7268.

(60) Frauenheim, T.; Seifert, G.; Elstner, M.; Hagnal, Z.; Jungnickel, G.; Porezag, D.; Suhai, S.; Scholz, R. A Self-Consistent Charge Density-Functional Based Tight-Binding Method for Predictive Materials Simulations in Physics, Chemistry and Biology. *Phys. Stat. Sol.* (b) 2000, 217, 41-62.

(61) Frauenheim, T.; Seifert, G.; Elstner, M.; Niehaus, T.; Koehler, C.; Amkreutz, M.; Sternberg, M.; Hajnal, Z.; Di Carlo, A.; Suhai, S. Atomistic simulations of complex materials: ground-state and excited-state properties. *Journal of Physics: Condensed Matter* 2002, 14, 3015-3047.

(62) Pecchia, A.; Di Carlo, A. Atomistic Theory of Transport in Organic and Inorganic Nanostructures. *Rep Prog Phys* 2004, 67, 1497-1561.

(63) Porezag, D.; Frauenheim, T.; Kohler, T.; Seifert, G.; Kaschner, R. Construction of tight-binding-like potentials on the basis of density-functional theory: Application to Carbon. *Phys. Rev. B* 1995, 51, 12947-12957.

(64) Brandbyge, M.; Mozos, J.-L.; Ordejon, P.; Taylor, J.; Stokbro, K. Density-functional method for nonequilibrium electron transport. *Phys. Rev. B* 2002, 65, 165401/1-165401/17.

(65) Taylor, J.; Guo, H.; Wang, J. Ab initio modeling of quantum transport properties of molecular electronic devices. *Physical Review B* 2001, 63, 245407.

(66) Brandbyge, M.; Mozos, J.-L.; Ordejon, P.; Taylor, J.; Stokbro, K. Density-functional method for nonequilibrium electron transport. *Physical Review B: Condensed Matter and Materials Physics* 2002, 65, 165401/1-165401/17.

(67) ATK version 2.0.4

(68) Andrews, D. Q.; Van Duyne, R. P.; Ratner, M. A. Stochastic Modulation in Molecular Electronic Transport Junctions: Molecular Dynamics Coupled with Charge Transport Calculations. *Nano Lett.* 2008, 8, 1120-1126.

(69) Tykwinski, R.; Zhao, Y. Cross-Conjugated Oligo(enzymes). *Synlett* 2002, 1939-1953.

(70) Bruschi, M.; Giuffreda, M. G.; Lu-thi, H. P. Through versus Cross Electron Delocalization in Polytriacetylene Oligomers: A Computational Analysis. *Chem Phys Chem* 2005, 6, 511-519.

(71) Bruschi, M.; Giuffreda, M. G.; Lüthi, H. P. trans versus geminal Electron Delocalization in Tetra- and Diethynylethenes: A New Method of Analysis. *Chemistry—A European Journal* 2002, 8, 4216-4227.

(72) Giuffreda, M. G.; Bruschi, M.; Lu-thi, H. P. Electron Delocalization in Linearly-Conjugated Systems: A Concept for Quantitative Analysis. *Chemistry—A European Journal* 2004, 10, 5671-5680.

(73) Moonen, N. N. P.; Pomerantz, W. C.; Gist, R.; Boudon, C.; Gisselbrecht, J. P.; Kawai, T.; Kishioka, A.; Gross, M.; Irie, M.; Diederich, F. Donor-substituted cyanoethynylethenes: pi-Conjugation and band-gap tuning in strong charge-transfer chromophores. *Chemistry—a European Journal* 2005, 11, 3325-3341.

(74) Solomon, G. C.; Gagliardi, A.; Pecchia, A.; Frauenheim, T.; Carlo, A. D.; Reimers, J. R.; Hush, N. S. The symmetry of single-molecule conduction. *The Journal of Chemical Physics* 2006, 125, 184702.

(75) Cho, J.; Zhao, Y.; Tykwinski, R. R. Synthesis and characterization of cross-conjugated oligo(phenylene enynylene)s. *ARKIVOC* 2005, (iv), 142-150.

(76) Zhitenev, N. B.; Meng, H.; Bao, Z. Conductance of Small Molecular Junctions. *Physical Review Letters* 2002, 88, 226801.

(77) Dadosh, T.; Gordin, Y.; Krahne, R.; Khivrich, I.; Mahalu, D.; Frydman, V.; Sperling, J.; Yacoby, A.; Bar-Joseph, I. Measurement of the conductance of single conjugated molecules. *Nature* 2005, 436, 677-680.

(78) Metzger, R. M. Unimolecular rectifiers: Present status. *Chemical Physics* 2006, 326, 176-187.

(79) Miller, O. D.; Muralidharan, B.; Kapur, N.; Ghosh, A. W. Rectification by charging: Contact-induced current asymmetry in molecular conductors. *Physical Review B (Condensed Matter and Materials Physics)* 2008, 77, 125427-10.

(80) Scott, G. D.; Chichak, K. S.; Peters, A. J.; Cantrill, S. J.; Stoddart, J. F.; Jiang, H. W. Mechanism of enhanced rectification in unimolecular Borromean ring devices. *Physical Review B (Condensed Matter and Materials Physics)* 2006, 74, 113404-4.

(81) Reichert, J.; Ochs, R.; Beckmann, D.; Weber, H. B.; Mayor, M.; Löhneysen, H. v. Driving Current through Single Organic Molecules. *Physical Review Letters* 2002, 88, 176804.

(82) Mujica, V.; Ratner, M. A.; Nitzan, A. Molecular rectification: why is it so rare? *Chemical Physics* 2002, 281, 147-150.

(83) Vladimiro, M.; Mathieu, K.; Adrian, R.; Mark, R. Current-voltage characteristics of molecular wires: Eigenvalue staircase, Coulomb blockade, and rectification. *The Journal of Chemical Physics* 1996, 104, 7296-7305.

(84) Meinhard, J. E. Organic Rectifying Junction. *Journal of Applied Physics* 1964, 35, 3059-3060.

(85) Zhou, C.; Deshpande, M. R.; Reed, M. A.; L. Jones, I.; Tour, J. M. Nanoscale metal/self-assembled monolayer/metal heterostructures. *Applied Physics Letters* 1997, 71, 611-613.

(86) Ashwell, G. J.; Urasinska, B.; Tyrrell, W. D. Molecules that mimic Schottky diodes. *Physical Chemistry Chemical Physics* 2006, 8, 3314-3319.

(87) Stokbro, K.; Taylor, J.; Brandbyge, M. Do Aviram-Ratner Diodes Rectify? *J. Am. Chem. Soc.* 2003, 125, 3674-3675.

(88) Armstrong, N.; Hoft, R. C.; McDonagh, A.; Cortie, M. B.; Ford, M. J. Exploring the Performance of Molecular Rectifiers: Limitations and Factors Affecting Molecular Rectification. *Nano Lett.* 2007, 7, 3018-3022.

(89) Ashwell, G. J.; Urasinska, B.; Wang, C.; Bryce, M. R.; Grace, I.; Lambert, C. J. Single-molecule electrical studies on a 7 nm long molecular wire. *Chemical Communications* 2006, 4706-4708.

(90) Guisinger, N. P.; Basu, R.; Greene, M. E.; Baluch, A. S.; Hersam, M. C. Observed suppression of room temperature negative differential resistance in organic monolayers on Si(100). *Nanotechnology* 2004, S452.

(91) Yablonovitch, E. The Chemistry of Solid-State Electronics. *Science* 1989, 246, 347-351.
(92) Guo, X.; Whalley, A.; Klare, J. E.; Huang, L.; O'Brien, S.; Steigerwald, M.; Nuckolls, C. Single-Molecule Devices as Scaffolding for Multicomponent Nanostructure Assembly. *Nano Lett.* 2007, 7, 1119-1122.

What is claimed is:

1. A molecular quantum interference device, comprising:
   (a) at least one molecular quantum interference unit having a first terminal group and a second terminal group between which quantum interference affects electrical conduction;
   (b) at least two molecular spacers, each having a first terminal group and a second terminal group, wherein a first one of the at least two molecular spacers is coupled to the molecular quantum interference unit through a chemical bonding between the first terminal group of the first molecular spacer and the second terminal group of the molecular quantum interference unit, and a second one of the two molecular spacers is coupled to the molecular quantum interference unit through a chemical bonding between the second terminal group of the second molecular spacer and the first terminal group of the molecular quantum interference unit, respectively;
   (c) a first electrode electrically coupled to the second molecular spacer; and
   (d) a second electrode electrically coupled to the first molecular spacer; ps wherein the at least two molecular spacers comprise at least one more spacer coupled between the molecular quantum interference unit and one of the first electrode and the second electrode.

2. The device of claim 1, wherein at least one of the first electrode and the second electrode is electrically coupled to a corresponding molecular spacer through a chemical bonding.

3. The device of claim 1, wherein at least one of the first electrode and the second electrode is electrically coupled to a corresponding molecular spacer through a non-chemical bonding.

4. The device of claim 1, wherein a current source is electrically coupled to at least one of the first electrode and the second electrode for establishing a bias current or voltage across the first electrode and the second electrode.

5. The device of claim 4, wherein when a bias current or voltage is established across the first electrode and the second electrode, a transmission spectrum is measurable between the first electrode and the second electrode and variable with the bias voltage.

6. The device of claim 1, wherein each of the first and second electrodes comprises a material having a work function for electron tunneling between the first and second electrodes, respectively, through the molecular spacers and the molecular quantum interference unit.

7. The device of claim 6, wherein each of the first and second electrodes comprises an electrically conducting or semi-conducting material.

8. The device of claim 7, wherein each of the first and second electrodes comprises at least one of gold, copper, platinum, palladium, silver, silicon, graphene, carbon nanotubes, iridium, ITO and doped semiconductor materials.

9. The device of claim 1, wherein the molecular quantum interference unit comprises one selected from the group of a cross-conjugated unit, a meta substituted phenyl ring, a substituted cyclic system that is not a phenyl ring, and a π-stacked unit.

10. The device of claim 9, wherein the cross-conjugated unit comprises a cyclic or acyclic cross-conjugated unit.

11. The device of claim 9, wherein each of the at least two molecular spacers comprises one selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them.

12. The device of claim 11, wherein each of the chemical bonding between the first terminal group of the first molecular spacer and the second terminal group of the molecular quantum interference unit, and the chemical bonding between the second terminal group of the second molecular spacer and the first terminal group of the molecular quantum interference unit comprises a carbon-carbon single bond.

13. A molecular quantum interference device, comprising:
   (a) at least one molecular spacer having a first terminal group and a second terminal group;
   (b) at least two molecular quantum interference units, each having a first terminal group and a second terminal group between which quantum interference affects electrical conduction, wherein a first one of the at least two molecular quantum interference units is coupled to the at least one molecular spacer through a chemical bonding between the first terminal group of the at least one molecular spacer and the second terminal group of the first molecular quantum interference unit, and a second one of the at least two molecular quantum interference units is coupled to the at least one molecular spacer through a chemical bonding between the second terminal group of the at least one molecular spacer and the first terminal group of the second molecular quantum interference unit, respectively;
   (c) a first electrode electrically coupled to the first molecular quantum interference unit; and
   (d) a second electrode electrically coupled to the second molecular quantum interference unit;
wherein the at least one molecular spacer comprises at least two molecular spacers coupled between the at least two molecular quantum interference units or between one of the first electrode and the second electrode and one of the at least two molecular quantum interference units.

14. The device of claim 13, wherein at least one of the first electrode and the second electrode is electrically coupled to a corresponding molecular quantum interference unit through a chemical bonding.

15. The device of claim 13, wherein at least one of the first electrode and the second electrode is electrically coupled to a corresponding molecular quantum interference unit through a non-chemical bonding.

16. The device of claim 13, wherein a current source is electrically coupled to at least one of the first electrode and the second electrode for establishing a bias current or voltage across the first electrode and the second electrode.

17. The device of claim 16, wherein when a bias current or voltage is established across the first electrode and the second electrode, a transmission spectrum is measurable between the first electrode and the second electrode and variable with the bias voltage.

18. The device of claim 13, wherein each of the at least two molecular quantum interference units comprises one selected from the group of a cross-conjugated unit, a meta substituted phenyl ring, a substituted cyclic system that is not a phenyl ring, and a π-stacked unit.

19. The device of claim 18, wherein the cross-conjugated unit comprises a cyclic or acyclic cross-conjugated unit.

20. The device of claim 18, wherein the at least one molecular spacer comprises one selected from the group of a single bonded carbon unit, a double bonded carbon unit, a triple bonded carbon unit, a phenyl ring, a thiophene ring, an oxygen atom, a nitrogen atom, a sulphur atom, a silicon atom, a phosphorus atom, a boron atom and any combination of them.

21. The device of claim 13, wherein each of the chemical bonding between the first terminal group of the at least one molecular spacer and the second terminal group of the first molecular quantum interference unit, and the chemical bonding between the second terminal group of the at least one molecular spacer and the first terminal group of the second molecular quantum interference unit comprises a carbon-carbon single bond.

22. The device of claim 13, wherein each of the first and second electrodes comprises a material having a work function for electron tunneling between the first and second electrodes, respectively, through the at least one molecular spacer and the at least two molecular quantum interference units.

23. The device of claim 22, wherein each of the first and second electrodes comprises an electrically conducting or semi-conducting material.

24. The device of claim 23, wherein each of the first and second electrodes comprises at least one of gold, copper, platinum, palladium, silver, silicon, graphene, carbon nanotubes, iridium, ITO and doped semiconductor materials.

25. A molecular quantum interference device, comprising:
(a) at least one molecular spacer having a first terminal group and a second terminal group;
(b) at least two molecular quantum interference units, each having a first terminal group and a second terminal group between which quantum interference affects electrical conduction, wherein a first one of the at least two molecular quantum interference units is coupled to the at least one molecular spacer through a chemical bonding between the first terminal group of the at least one molecular spacer and the second terminal group of the first molecular quantum interference unit, and a second one of the at least two molecular quantum interference units is coupled to the at least one molecular spacer through a chemical bonding between the second terminal group of the at least one molecular spacer and the first terminal group of the second molecular quantum interference unit, respectively;
(c) a first electrode electrically coupled to the first molecular quantum interference unit; and
(d) a second electrode electrically coupled to the second molecular quantum interference unit;
wherein the at least two molecular quantum interference units comprise at least one more molecular quantum interference unit coupled between the at least one molecular spacer and one of the first electrode and the second electrode.

* * * * *

UNITED STATES PATENT AND TRADEMARK OFFICE
CERTIFICATE OF CORRECTION

PATENT NO. : 8,022,394 B2
APPLICATION NO. : 12/338648
DATED : September 20, 2011
INVENTOR(S) : Gemma Solomon et al.

Page 1 of 1

It is certified that error appears in the above-identified patent and that said Letters Patent is hereby corrected as shown below:

In column 1, Lines 24-37, please delete:

"STATEMENT OF FEDERALLY SPONSORED RESEARCH
This invention was made with government support under grant numbers FA8650- 06-C-7617 and F49620-02-1-0381, awarded by the Air Force Office of Sponsored Research; grant number FA 9550-06-1-0558, awarded by the Department of Defense/Air Force Office of Sponsored Research; grant number N00014-05-1-0021, awarded by the Office of Naval Research of the United States; grant numbers CHE-0719420, 4101-19917/EEC-0634750, DMR-0520513, 501-0791-04/EEC-0228390, and CHE-0414554, awarded by the National Science Foundation. The Government has certain rights in the invention."

In column 1, Lines 24-37, please add:

--STATEMENT OF FEDERALLY-SPONSORED RESEARCH
This invention was made with government support under grant numbers CHE0719420, EEC0228390, CHE0414554, EEC0634750 and DMR0520513, awarded by the National Science Foundation and grant number N00014-05-1-0021, awarded by the Office of Naval Research and grant numbers FA8650-06-C-7617, F49620-02-1-0381, FA9550-06-1-0558, awarded by the Air Force Office of Scientific Research. The government has certain rights in the invention.--

Signed and Sealed this
Eighth Day of November, 2011

David J. Kappos
*Director of the United States Patent and Trademark Office*